US012695271B2

(12) United States Patent
Ono

(10) Patent No.: US 12,695,271 B2
(45) Date of Patent: Jul. 28, 2026

(54) LIGHT SOURCE DEVICE AND MEASUREMENT APPARATUS

(71) Applicant: FUJIFILM Business Innovation Corp., Tokyo (JP)

(72) Inventor: Seiji Ono, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 940 days.

(21) Appl. No.: 17/978,963

(22) Filed: Nov. 1, 2022

(65) Prior Publication Data

US 2023/0246414 A1 Aug. 3, 2023

(30) Foreign Application Priority Data

Feb. 2, 2022 (JP) ................................. 2022-014957

(51) Int. Cl.
| | |
|---|---|
| *H01S 5/042* | (2006.01) |
| *G01S 7/484* | (2006.01) |
| *G01S 17/10* | (2020.01) |
| *H01S 5/42* | (2006.01) |

(52) U.S. Cl.
CPC ............ *H01S 5/0428* (2013.01); *G01S 7/484* (2013.01); *G01S 17/10* (2013.01); *H01S 5/423* (2013.01)

(58) Field of Classification Search
CPC .................................................... H01S 5/0428
See application file for complete search history.

(56) References Cited

U.S. PATENT DOCUMENTS

| | | | | |
|---|---|---|---|---|
| 8,901,831 B2 * | 12/2014 | Du | ......................... | H05B 47/10 |
| | | | | 315/307 |
| 2009/0057534 A1 * | 3/2009 | Liu | ......................... | H05B 45/54 |
| | | | | 250/205 |
| 2009/0066262 A1 * | 3/2009 | Tateishi | .............. | H02M 3/1584 |
| | | | | 315/291 |
| 2012/0050697 A1 * | 3/2012 | Suzuki | ................... | H05B 45/56 |
| | | | | 315/185 R |
| 2016/0124293 A1 * | 5/2016 | Sato | ................... | H05B 41/3928 |
| | | | | 348/761 |
| 2021/0296862 A1 * | 9/2021 | Kondo | .................... | H01S 5/426 |

FOREIGN PATENT DOCUMENTS

| | | |
|---|---|---|
| JP | 2002137445 | 5/2002 |
| JP | 2012076407 | 4/2012 |

OTHER PUBLICATIONS

"Search Report of Europe Counterpart Application", issued on Jun. 15, 2023, p. 1-p. 13.

* cited by examiner

*Primary Examiner* — Marisa V Conlon
(74) *Attorney, Agent, or Firm* — JCIPRNET

(57) ABSTRACT

A light source device includes: a light-emitting section including plural light-emitting elements; a shifter that performs a shift operation; and a controller that causes the shifter to perform the shift operation to set, among the plural light-emitting elements, a light-emitting element which is to emit light, that changes the shifter to an OFF state after the set light-emitting element is shifted to a state in which the set light-emitting element is able to emit light, and that causes the set light-emitting element to emit light multiple times by turning ON and OFF a voltage application side of a power source, the power source supplying a light-emitting current which causes the light-emitting element to emit light.

18 Claims, 13 Drawing Sheets

LIGHT SOURCE DEVICE AND MEASUREMENT APPARATUS

CROSS-REFERENCE TO RELATED APPLICATIONS

This application is based on and claims priority under 35 USC 119 from Japanese Patent Application No. 2022-014957 filed Feb. 2, 2022.

BACKGROUND

(i) Technical Field

The present disclosure relates to a light source device and a measurement apparatus.

(ii) Related Art

Japanese Unexamined Patent Application Publication No. 2012-76407 discloses a light-emitting device including plural light-emitting chips and a transfer signal supplier. Each of the plural light-emitting chips includes a substrate, a light-emitting section, and a transfer section. The light-emitting section includes plural light-emitting elements disposed on the subject in a row. The transfer section includes plural transfer elements. The plural transfer elements are disposed on the substrate so as to correspond to the respective light-emitting elements. The plural transfer elements are sequentially turned ON to select the corresponding light-emitting elements to cause them to emit light or stop emitting light. The transfer signal supplier sends a transfer signal to the plural light-emitting chips so that the ON state is sequentially transferred to the plural transfer elements of each of the light-emitting chips. During a period for which one of the transfer elements in the transfer section is changed from the OFF state to the ON state, a current flows in this transfer section. In relation to the value of this current, the transfer signal supplier sets a smaller absolute value of a current that flows in the transfer section during the next period for which another transfer element to be subsequently turned ON is changed from the OFF state to the ON state.

SUMMARY

The following type of light-emitting unit is known. The light emitting unit includes a light-emitting section and a shifter. The light-emitting section includes plural light-emitting elements. The shifter performs a shift operation to set a light-emitting element which is to emit light. The light-emitting unit then causes the light-emitting element set by the shifter to emit light. In this type of light-emitting unit, power is also consumed in the shifter.

Aspects of non-limiting embodiments of the present disclosure relate to a light source device and a measurement apparatus that can reduce power consumption, compared with the configuration in which a shifter of the light source device is maintained in the ON state.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light source device including: a light-emitting section including plural light-emitting elements; a shifter that performs a shift operation; and a controller that causes the shifter to perform the shift operation to set, among the plural light-emitting elements, a light-emitting element which is to emit light, that changes the shifter to an OFF state after the set light-emitting element is shifted to a state in which the set light-emitting element is able to emit light, and that causes the set light-emitting element to emit light multiple times by turning ON and OFF a voltage application side of a power source, the power source supplying a light-emitting current which causes the light-emitting element to emit light.

BRIEF DESCRIPTION OF THE DRAWINGS

Exemplary embodiments of the present disclosure will be described in detail based on the following figures, wherein:

FIG. 4 is a timing chart illustrating the operation of the light source device according to the first exemplary embodiment;

FIG. 11 is a timing chart illustrating the operation of the light source device according to the fourth exemplary embodiment.

DETAILED DESCRIPTION

Exemplary embodiments of the disclosure will be described below in detail with reference to the accompanying drawings.

A light-emitting unit including a shifter and a light-emitting section provided with plural light-emitting elements is known. The shifter performs a shift operation to set a light-emitting element which is to emit light. The light-emitting unit then causes the light-emitting element set by the shifter to emit light. It has been thought that, in this type of light-emitting unit, a light-emitting element is not turned ON if the ON state of the shifter is not maintained. However, maintaining the shifter in the ON state may waste power which would not be consumed otherwise.

First Exemplary Embodiment

Figure 1:
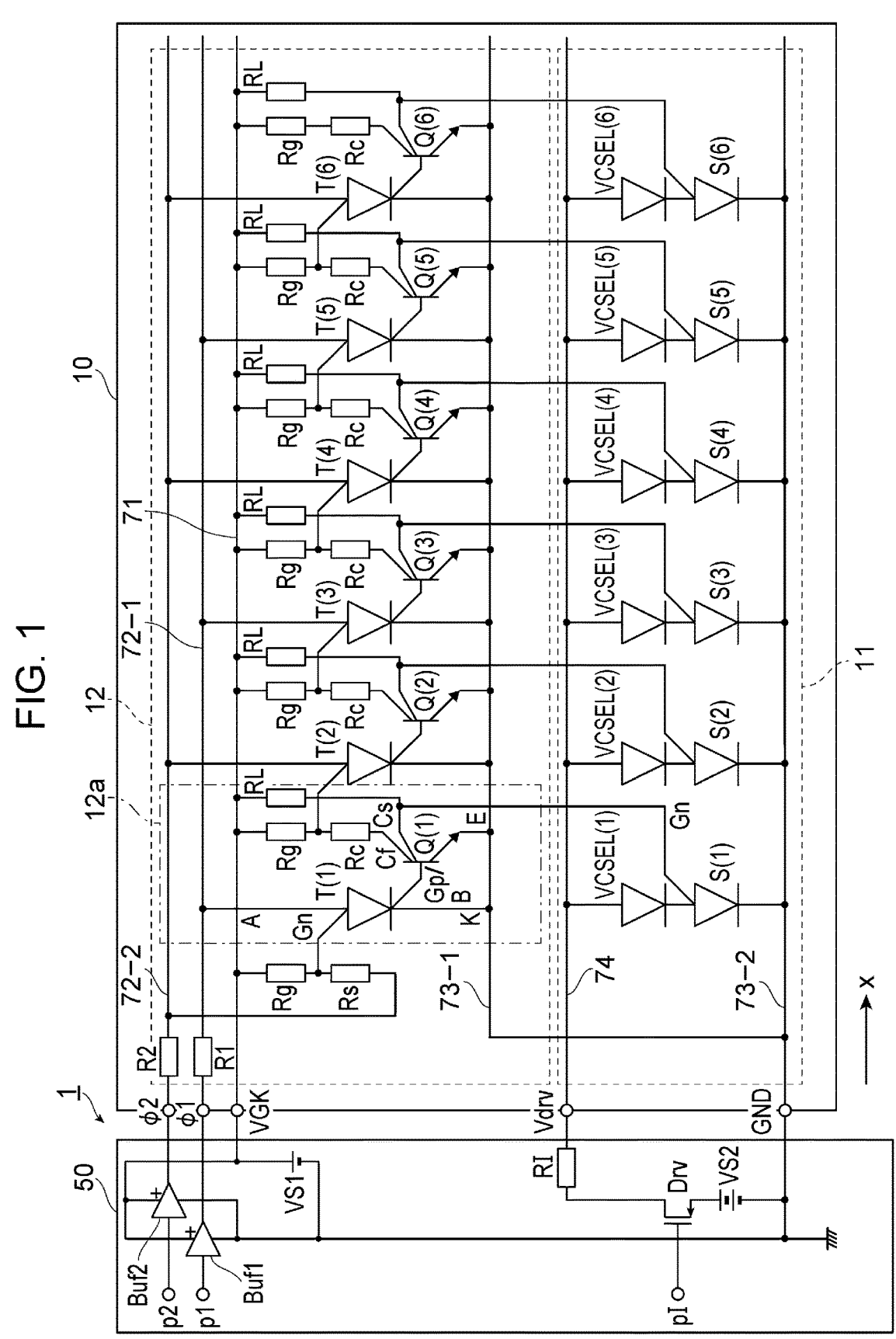
FIG. 1 illustrates a light source device according to a first exemplary embodiment.

FIG. 1 illustrates a light source device 1 according to a first exemplary embodiment. In FIG. 1, the right-side direction in the plane of the drawing is set to be a +x direction. In FIG. 1, thyristors and transistors are represented by symbols, and resistors are indicated by rectangles. Other drawings are also expressed in a similar manner.

The light source device 1 shown in FIG. 1 includes a light-emitting unit 10 and a controller 50.

(Light-Emitting Unit 10)

The light-emitting unit 10 includes a GND terminal, a VGK terminal, a φ1 terminal, a φ2 terminal, and a Vdrv terminal on one side (–x direction). GND represents a ground potential, which is a reference voltage. Hereinafter, the ground potential will be called the ground potential GND. VGK represents a power supply potential (hereinafter called the power supply potential VGK).

The light-emitting unit 10 includes a light-emitting section 11 and a shifter 12.

The light-emitting section 11 includes multiple vertical cavity surface emitting lasers (VCSELs) and multiple light-emission control thyristors S. In FIG. 1, six VCSELs (VCSEL(1) through VCSEL(6)) and six light-emission control thyristors S (light-emission control thyristors S(1) through S(6)) are shown. Hereinafter, the VCSEL(1) through VCSEL(6) may collectively be called the VCSEL unless it is necessary to distinguish them from each other. Likewise, the light-emission control thyristors S(1) through S(6) may collectively be called the light-emission control thyristor S unless it is necessary to distinguish them from each other. The cathode of the VCSEL and the anode of the light-emission control thyristor S are connected to each other. That is, the VCSEL and the light-emission control thyristor S denoted by the same number are connected in series with each other. The six VCSELs and the six light-emission control thyristors S are arranged from one side (–x direction) to the other side (+x direction) of the light-emitting unit 10. The series-connected VCSEL and light-emission control thyristor S is an example of a light-emitting element. The VCSEL is an example of a surface emitting element. The light-emitting element may use a light-emitting diode LED or a light-emitting thyristor. However, the use of a VCSEL as the light-emitting element can increase the amount of light.

The shifter 12 includes multiple shift thyristors T, coupling transistors Q, power supply line resistors Rg and RL, and coupling resistors Rc. In FIG. 1, six shift thyristors T (shift thyristors T(1) through T(6)) and six coupling transistors Q (coupling transistors Q(1) through Q(6)) are shown. Hereinafter, the shift thyristors T(1) through T(6) may collectively be called the shift thyristor T unless it is necessary to distinguish them from each other. Likewise, the coupling transistors Q(1) through Q(6) may collectively be called the coupling transistor Q unless it is necessary to distinguish them from each other. The shifter 12 also includes six power supply line resistors Rg, six power supply line resistors RL, and six coupling resistors Rc, which are not denoted by numbers. A shift thyristor T, a coupling transistor Q, a power supply line resistor Rg, a power supply line resistor RL, and a coupling resistor Rc form a shift unit 12a. Six shift units 12a are arranged from one side (–x direction) to the other side (+x direction) of the shifter 12. The shifter 12 includes a power supply line resistor Rg and a start resistor Rs at the end of one side (–x direction). The light-emitting unit 10 also includes current limiting resistors R1 and R2. The shift thyristor T is an example of a shift element.

In the shift unit 12a, the shift thyristor T and the coupling transistor Q are connected to each other. The coupling transistor Q in the shift unit 12a is connected to the light-emission control thyristor S of the light-emitting section 11. The shift thyristors T(1) through T(6) and the coupling transistors Q(1) through Q(6) are respectively connected to each other. The light-emission control thyristors S(1) through S(6) and the coupling transistors Q(1) through Q(6) are respectively connected to each other. In the example in FIG. 1, the six shift thyristors T, six coupling transistors Q, and six pairs of light-emission control thyristors S and VCSELs are shown. However, the numbers of shift thyristors T, coupling transistors Q, and pairs of light-emission control thyristors S and VCSELs may be other than six. Plural pairs, each pair being constituted by a light-emission control thyristor S and a VCSEL connected in series with each other, may be connected to one coupling transistor Q. Plural VCSELs may be connected in parallel with one light-emission control thyristor S.

In the light-emitting unit 10, the VGK terminal is connected to a power supply line 71, the φ1 terminal is connected to a shift signal line 72-1, the φ2 terminal is connected to a shift signal line 72-2, the GND terminal is connected to ground lines 73-1 and 73-2, and the Vdrv terminal is connected to a light-emitting potential line 74. The shift signal lines 72-1 and 72-2 will be called the shift signal line 72 unless it is necessary to distinguish them from each other. The ground lines 73-1 and 73-2 will be called the ground line 73 unless it is necessary to distinguish them from each other.

The controller 50 includes power sources VS1 and VS2, buffers Buf1 and Buf2, a driver Drv, and a light-emitting current limiting resistor RI. The power source VS1 supplies a power supply potential VGK to the VGK terminal of the light-emitting unit 10. The power source VS1 is also used for the buffers Buf1 and Buf2. The power source VS2 supplies a light-emitting current to the Vdrv terminal of the light-emitting unit 10. The buffer Buf1 substantially outputs the voltage (power supply potential VGK) of the power source VS1 to the φ1 terminal of the light-emitting unit 10 when the shift signal p1 is at a high (H) level, while it substantially outputs the ground potential GND (=0 V) to the φ1 terminal when the shift signal p1 is at a low (L) level. The buffer Buf2 substantially outputs the voltage (power supply potential VGK) of the power source VS1 to the φ2 terminal of the light-emitting unit 10 when the shift signal p2 is at an H level, while it substantially outputs the ground potential GND (=0 V) to the φ2 terminal when the shift signal p2 is at an L level. The driver Drv is a PMOS transistor, for example, and is turned ON/OFF by a light-emitting signal pI applied to the gate of the PMOS transistor. When the driver Drv is turned ON, the voltage at the drain terminal reaches substantially the voltage of the power source VS2 (hereinafter called the light-emitting power supply potential VS2) and supplies a light-emitting current to the Vdrv terminal of the light-emitting unit 10 via the light-emitting current limiting resistor RI. That is, the power source VS1 is a power source for the shifter 12, while the power source VS2 is a power source for the light-emitting section 11. Instead of a PMOS transistor, the driver Dry may use another element, such as an insulated gate bipolar transistor (IGBT).

The relationship between the elements of the light-emitting unit 10 will be explained below by using the enlarged view of FIG. 2A. The light-emission control thyristor S, the shift thyristor T, and the coupling transistor Q may simply be called the light-emitting control thyristor, shift thyristor, and coupling transistor, respectively, without using the corresponding alphabetical characters. The light-emission control thyristor S and the shift thyristor T may collectively be called the thyristor when it is not necessary to distinguish them from each other.

(Operations of Shift Thyristor T, Coupling Transistor Q, Light-Emission Control Thyristor S, and VCSEL)

The basic operation of the light-emitting unit 10 will be described below.

Each of the shift thyristor T and the light-emission control thyristor S is an npnp thyristor. Each thyristor has an n-type cathode K (hereinafter simply called the cathode K), a p-type gate Gp (hereinafter simply called the p-gate Gp), an n-type gate Gn (hereinafter simply called the n-gate Gn), and a p-type anode A (hereinafter simply called the anode A). The light-emission control thyristor S does not use the p-gate Gp for a control operation, and the p-gate Gp is not shown in the drawings.

The coupling transistor Q is a multi-collector npn bipolar transistor. The coupling transistor Q has an n-type emitter E (hereinafter simply called the emitter E), a p-type base B (hereinafter simply called the base B), and n-type collectors Cf and Cs (hereinafter simply called the collectors Cf and Cs).

The above-described alphabetical characters for the thyristor T are used for all the thyristors T, the alphabetical characters for the light-emission control thyristor S are used for all the light-emission control thyristors S, and the alphabetical characters for the coupling transistor Q are used for all the coupling transistors Q. Bipolar transistors forming a thyristor discussed below are also represented by these characters. The thyristor is constituted by a combination of a single-collector npn bipolar transistor and a single-collector pnp bipolar transistor, which will be discussed later, and is thus also represented by an emitter E, a base B, and a collector C. Hereinafter, the anode, cathode, n-gate, p-gate, emitter, base, and collector will be called the anode A, cathode K, n-gate Gn, p-gate Gp, emitter E, base B, and collector C, respectively, even when these alphabetical characters are not shown in the drawings.

The shift thyristor T, the coupling transistor Q, and a set of the light-emission control thyristor S and the VCSEL are formed by a III-V compound semiconductor, such as GaAs. The forward voltage (diffusion potential) Vd at the junction of this compound semiconductor is set to be 1.5 V, while the saturation voltage Vc of a bipolar transistor formed by the compound semiconductor is set to be 0.3 V. The ground potential GND is set to be 0 V, and the voltage of the power source VS1 (power supply potential VGK) and the voltage of the power source VS2 (light-emitting power supply potential VS2) are set to be 7 V. For the shift signals p1 and p2 and the light-emitting signal pI, the L level is 0 V ("L" (0 V)) and the H level is 7 V ("H" (7 V)). When the light-emitting signal pI is made to have "H" (7 V), the driver Dry using a PMOS transistor as a driver element is turned OFF. When the light-emitting signal pI is made to have "L" (0 V), the driver Dry is turned ON.

Figures 2A, 2B:
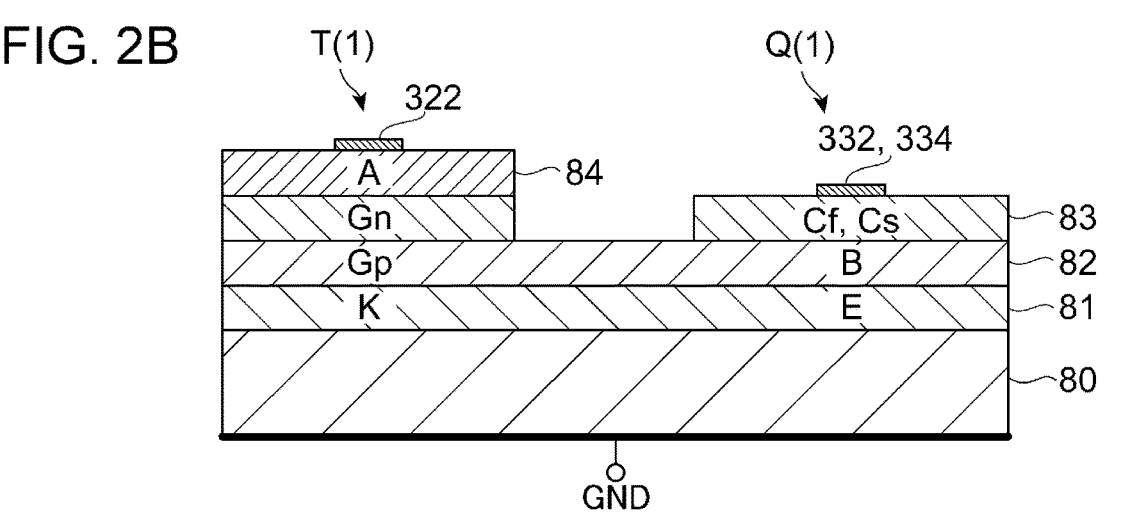
FIG. 2A is an equivalent circuit diagram for explaining the operation of a light-emitting unit by using a shift thyristor, a coupling transistor, and a set of a light-emission control thyristor and a vertical cavity surface emitting laser (VCSEL)
FIG. 2B is a partial sectional view illustrating the shift thyristor and the coupling transistor shown in FIG. 2A.

FIG. 2A is an equivalent circuit diagram for explaining the operation of the light-emitting unit 10 by using the shift thyristor T(1), the coupling transistor Q(1), and a set of the light-emission control thyristor S(1) and the VCSEL(1). FIG. 2B is a sectional view illustrating the shift thyristor T(1) and the coupling transistor Q(1) shown in FIG. 2A. In FIG. 2A, the shift thyristor T(2) is also shown.

As shown in FIG. 2A, the shift thyristor T(1) is constituted by a combination of an npn bipolar transistor Tr1 (hereinafter called the npn transistor Tr1) and a pnp bipolar transistor Tr2 (hereinafter called the pnp transistor Tr2). The base B of the npn transistor Tr1 is connected to the collector C of the pnp transistor Tr2. The collector C of the npn transistor Tr1 is connected to the base B of the pnp transistor Tr2. The emitter E of the npn transistor Tr1 serves as the cathode K of the shift thyristor T(1). The collector C of the npn transistor Tr1 (base B of the pnp transistor Tr2) serves as the n-gate Gn of the shift thyristor T(1). The collector C of the pnp transistor Tr2 (base B of the npn transistor Tr1) serves as the p-gate Gp of the shift thyristor T(1). The emitter E of the pnp transistor Tr2 serves as the anode A of the shift thyristor T(1).

The emitter E of the npn transistor Tr1, which serves as the cathode K of the shift thyristor T(1), is connected to the ground line 73-1 connected to the GND terminal to which the ground potential GND is supplied. The emitter E of the pnp transistor Tr2, which serves as the anode A of the shift thyristor T(1), is connected to the shift signal line 72-1 connected to the φ1 terminal. The n-gate Gn is connected to a node between the start resistor Rs and the power supply line resistor Rg connected in series with each other. The end of the start resistor Rs, which is not the end connected to the power supply line resistor Rg, is connected to the shift signal line 72-2 connected to the φ2 terminal. The end of the power supply line resistor Rg, which is not the end connected to the start resistor Rs, is connected to the power supply line 71 connected to the VGK terminal to which the power supply potential VGK is supplied. The shift signal p1 is supplied to the φ1 terminal, while the shift signal p2 is supplied to the φ2 terminal.

Regarding the coupling transistor Q(1), which is an npn transistor, the base B is connected to the p-gate Gp of the shift thyristor T(1) (the base B of the npn transistor Tr1 and the collector C of the pnp transistor Tr2), and the emitter E is connected to the ground line 73-1. The collector Cf is connected via the series-connected coupling resistor Rc and power supply line resistor Rg to the power supply line 71 to which the power supply potential VGK is supplied. The node between the coupling resistor Rc and the power supply line resistor Rg is connected to the n-gate Gn of the shift thyristor T(2).

The npn transistor Tr1 of the shift thyristor T(1) and the coupling transistor Q(1) form a current mirror circuit. That is, a current proportional to a current flowing through the npn transistor Tr1 flows through the coupling transistor Q(1).

The collector Cs of the coupling transistor Q(1) is connected to the n-gate Gn of the light-emission control thyristor S(1) and is also connected via the power supply line resistor RL to the voltage supply line 71 connected to the VGK terminal to which the power supply potential VGK is supplied.

As stated above, the VCSEL(1) and the light-emission control thyristor S(1) are connected in series with each other. That is, the anode A of the light-emission control thyristor S(1) and the cathode K of the VCSEL(1) are connected to each other. The cathode K of the light-emission control thyristor S(1) is connected to the ground line 73-2. The anode A of the VCSEL(1) is connected to the light-emitting potential line 74 connected to the Vdrv terminal. A light-emitting current is supplied to the Vdrv terminal from the power source VS2. More specifically, the supplying of the light-emitting current to the series-connected light-emission control thyristor S(1) and VCSEL(1) is controlled by turning ON/OFF the Vdrv terminal. That is, the Vdrv terminal is a terminal to which a voltage is applied (voltage application side) and is the positive side (+ side) in this example.

The anode A of the shift thyristor T(2) is connected to the shift signal line 72-2 connected to the ϕ2 terminal. As shown in FIG. 1, the anodes A of the odd-numbered shift thyristors T are connected to the shift signal line 72-1, while the anodes A of the even-numbered shift thyristors T are connected to the shift signal line 72-2. Except for the connection relationship of the shift thyristors T to the shift signal lines 72-1 and 72-2, the connection relationship between the shift thyristor T(2), coupling transistor Q(2), light-emission control thyristor S(2), and VCSEL(2) through the connection relationship between the shift thyristor T(6), coupling transistor Q(6), light-emission control thyristor S(6), and VCSEL(6) are similar to that of the shift thyristor T(1), coupling transistor Q(1), light-emission control thyristor S(1), and VCSEL(1). Hereinafter, the shift signals p1 and p2 may also be indicated by the shift signals p1(ϕ1) and p2(ϕ2), respectively.

The operation of the shift thyristor T(1) will first be discussed below.

The power supply line 71 is set at the power supply potential VGK (7 V), and the ground line 73 is set at the ground potential GND (0 V). The shift signals p1(ϕ1) and p2(ϕ2) are at "L" (0 V). At this time, the npn transistor Tr1 and the pnp transistor Tr2 forming the shift thyristor T(1) are in the OFF state. The n-gate Gn of the shift thyristor T(1) is connected to the node between the start resistor Rs and the power supply line resistor Rg connected in series with each other. The end of the start resistor Rs, which is not the end connected to the power supply line resistor Rg, is connected to the shift signal line 72-2 at "L" (0 V). The end of the power supply line resistor Rg, which is not the end connected to the start resistor Rs, is connected to the power supply line 71 at 7 V. Accordingly, the n-gate Gn is at the voltage obtained by distributing 7 V (voltage difference) between the start resistor Rs and the power supply line resistor Rg. If the voltage ratio between the start resistor Rs and the power supply line resistor Rg is 1:5, for example, the voltage at the n-gate Gn is 1.17 V. The light-emitting signal pI is at "H" (7 V) and the driver Dry is OFF. Accordingly, the light-emitting power supply potential VS2 is not applied to the light-emitting potential line 74. The above-described state is the initial state.

When the shift signal p1(ϕ1) is changed from "L" (0 V) to "H" (7 V), the voltage difference (5.83 V) between the emitter E ("H" (7 V)) and the base B (n-gate Gn) (1.17 V) of the pnp transistor Tr2 exceeds the forward voltage Vd (1.5 V), and the junction between the emitter E and the base B is forward-biased. The pnp transistor Tr2 is thus shifted from the OFF state to the ON state. Then, the voltage at the collector C of the pnp transistor Tr2 (the base B of the npn transistor Tr1) results in 6.7 V obtained by subtracting the saturation voltage Vc (0.3 V) from the voltage at the emitter E ("H" (7 V)). The voltage difference (6.7 V) between the emitter E (0 V) and the base B (6.7 V) of the npn transistor Tr1 exceeds the forward voltage Vd (1.5 V). The junction between the emitter E and the base B is thus forward-biased, and the npn transistor Tr1 is shifted from the OFF state to the ON state. Since both of the npn transistor Tr1 and the pnp transistor Tr2 of the shift thyristor T(1) are turned ON, the shift thyristor T(1) is shifted from the OFF state to the ON state. "The shift thyristor T is shifted from the OFF state to the ON state" may also be called "the shift thyristor T is turned ON". "The shift thyristor T is shifted from the ON state to the OFF state" may also be called "the shift thyristor T is turned OFF".

When the shift signal p1(ϕ1) is shifted from "L" (0 V) to "H" (7 V) in the initial state, the shift thyristor T(1) is turned ON and is shifted from the OFF state to the ON state. The state in which the shift thyristor T can be turned ON when the anode A is made to have "H" (7 V) will be called "the shift thyristor T is in a state in which it can shift to the ON state". This also applies to other elements.

When the shift thyristor T(1) is turned ON, the voltage at the n-gate Gn of the shift thyristor T(1) is changed to 0.3 V, which is the saturation voltage Vc. The voltage at the anode A is determined by the internal resistance of the current limiting resistor R1 and that of the shift thyristor T(1). In this example, the voltage at the anode A is assumed to be 2.0 V. That is, when the shift thyristor T(1) is turned ON, the voltage of the shift signal line 72-1 is shifted from 7 V to 2.0 V. Then, the voltage at the p-gate Gp of the shift thyristor T(1) is changed to 1.7 V.

As described above, the shift thyristor T(1) is turned ON when the voltage at the n-gate Gn becomes lower than the voltage at the anode A by a value equal to the forward voltage Vd (1.5 V) or greater. The shift thyristor T(1) is turned OFF when the voltage of the shift signal line 72-1 (the voltage across the anode A and the cathode K) becomes lower than the above-described value, that is, 2.0 V. For example, when the anode A is made to have "L" (0 V), the voltage difference between the anode A and the cathode K is changed to 0 V, and the shift thyristor T(1) is turned OFF. On the other hand, when the voltage of the shift signal line 72-1 (voltage difference between the anode A and the cathode K) is 2.0 V or greater, the ON state of the shift thyristor T(1) is maintained. Hence, 2.0 V will be called the holding voltage. Even with the application of the holding voltage, if a current for holding the ON state of the shift thyristor T(1) is not supplied, the ON state of the shift thyristor T(1) is not maintained. The current for holding the ON state will be called the holding current.

Next, the operation of the coupling transistor Q(1) will be explained below.

When the shift thyristor T(1) is in the OFF state, the npn transistor Tr1 is also in the OFF state. Accordingly, the coupling transistor Q(1) is also in the OFF state. At this time, the emitter E of the coupling transistor Q(1) is set at the ground potential GND (0 V). The voltage at the collector Cf becomes equal to the power supply potential VGK (7 V) via the series-connected power supply line resistor Rg and coupling resistor Rc. The voltage at the collector Cs becomes equal to the power supply potential VGK (7 V) via the power supply line resistor RL.

When the shift thyristor T(1) is turned ON, that is, when the npn transistor Tr1 enters the ON state, the p-gate Gp of the shift thyristor T(1) is changed to 1.7 V, as discussed above. Since the base B of the coupling transistor Q(1) is connected to the p-gate Gp of the shift thyristor T(1), the voltage at the junction between the emitter E and the base B becomes greater than or equal to the forward voltage Vd (1.5 V). That is, the junction between the emitter E and the base B is forward-biased, and the coupling transistor Q(1) is shifted from the OFF state to the ON state. Then, the voltages at the collectors Cf and Cs become equal to the saturation voltage Vc (0.3 V). The voltage at the node between the power supply line resistor Rg and the coupling resistor Rc (n-gate Gn of the shift thyristor T(2)) is determined as follows. The voltage difference between the voltage (7 V) of the power supply line 71 and the voltage (0.3 V) of the collector Cf is 6.7 V. The voltage obtained by distributing 6.7 V between the power supply line resistor Rg and the coupling resistor Rc is the voltage at the node between the power supply line resistor Rg and the coupling resistor Rc. If the voltage ratio between the power supply line resistor Rg and the coupling resistor Rc is 5:1, for example, the voltage at the node between the power supply line resistor Rg and the coupling resistor Rc (n-gate Gn of the shift thyristor T(2)) is 1.42 V.

The anode A of the shift thyristor T(2) is connected to the shift signal line 72-2 to which the shift signal p2(φ2) is supplied. Since the shift signal p2(φ2) is at "L" (0 V), the shift thyristor T(2) is not turned ON. When the shift signal p2(φ2) is changed from "L" (0 V) to "H" (7 V), the voltage at the anode A of the shift thyristor T(2) is changed to "H" (7 V). The voltage difference (5.58 V) between the anode A and the n-gate Gn (1.42 V) becomes greater than the forward voltage Vd (1.5 V). That is, the junction between the n-gate Gn and the anode A is forward-biased, and the shift thyristor T(2) is turned ON. In this manner, multiple elements are provided and the element which is turned ON is sequentially shifted. This operation is called a shift operation. In the exemplary embodiments of the specification, elements to be turned ON or OFF are shift elements. Using shift thyristors as the shift elements makes it easy to perform this shift operation.

The operation of the light-emission control thyristor S(1) and the VCSEL(1) will now be discussed below.

The collector Cs of the coupling transistor Q(1) is connected to the n-gate Gn of the light-emission control thyristor S(1). When the voltage at the collector Cs of the coupling transistor Q(1) is changed to the saturation voltage Vc (0.3 V), the voltage at the n-gate Gn of the light-emission control thyristor S(1) is also changed to 0.3 V. The anode A of the light-emission control thyristor S(1) is connected to the light-emitting potential line 74 via the VCSEL(1). Since the light-emitting signal pI is at "H" (7 V), the driver Dry is OFF. Hence, the light-emitting power supply potential VS2 (7 V) is not applied to the light-emitting potential line 74.

When the light-emitting signal pI is changed from "H" (7 V) to "L" (0 V), the driver Dry is shifted from OFF to ON. Then, the light-emitting power supply potential VS2 (7 V) is applied to the light-emitting potential line 74. The n-gate Gn of the light-emission control thyristor S(1) is at 0.3 V. If the voltage of the light-emitting potential line 74 is higher than the n-gate Gn (0.3 V) by 2Vd (=3.0 V) or greater, the anode A and the n-gate Gn of the light-emission control thyristor S(1) is forward-biased, and the light-emission control thyristor S(1) is turned ON. Then, a current flows through the light-emission control thyristor S(1) and the VCSEL(1) connected in series with each other, thereby causing the VCSEL(1) to emit light. When the VCSEL(1) emits light, the voltage of the light-emitting potential line 74 is changed to about 3 V. The state in which the coupling transistor Q(1) is turned ON and the n-gate Gn of the light-emission control thyristor S(1) is at 0.3 V is a state in which the VCSEL(1) emits light when the driver Dry is turned ON. Hence, this state will be called a state in which the VCSEL(1) can emit light. As the name suggests, the light-emission control thyristor S controls the light emission of the VCSEL by using the potential of the n-gate Gn.

In the initial state, the power supply line 71 is at the power supply potential VGK (7 V), the ground line 73 is at the ground potential GND (0 V), the shift signals p1(φ1) and p2(φ2) are at "L" (0 V), the driver Dry is OFF, and the light-emitting power supply potential VS2 (7 V) is not applied to the light-emitting potential line 74. In the initial state, the shift thyristor T(1) is a state in which it can shift to the ON state.

Then, when the shift signal p1(φ1) (shift signal line 72-1) is changed from "L" (0 V) to "H" (7 V), the shift thyristor T(1) is turned ON and shifts from the OFF state to the ON state. Then, the coupling transistor Q(1) is shifted from the OFF state to the ON state. Then, the n-gate Gn of the light-emission control thyristor S(1) is changed to the saturation voltage Vc (0.3 V), and the VCSEL(1) enters a state in which it can emit light. When the coupling transistor Q(1) is in the ON state, the shift thyristor T(2) enters a state in which it can shift to the ON state. When the shift signal p2(φ2) (shift signal line 72-2) is changed from "L" (0 V) to "H" (7 V), the shift thyristor T(2) is turned ON. When the shift signal p1(φ1) (shift signal line 72-1) is changed from "H" (7 V) to "L" (0 V), the shift thyristor T(1) is turned OFF since the cathode K and the anode A are made to have "L" (0 V). The other shift thyristors T, coupling transistors Q, light-emission control thyristors S, and VCSELs are operated in a similar manner.

Figures 3A, 3B:
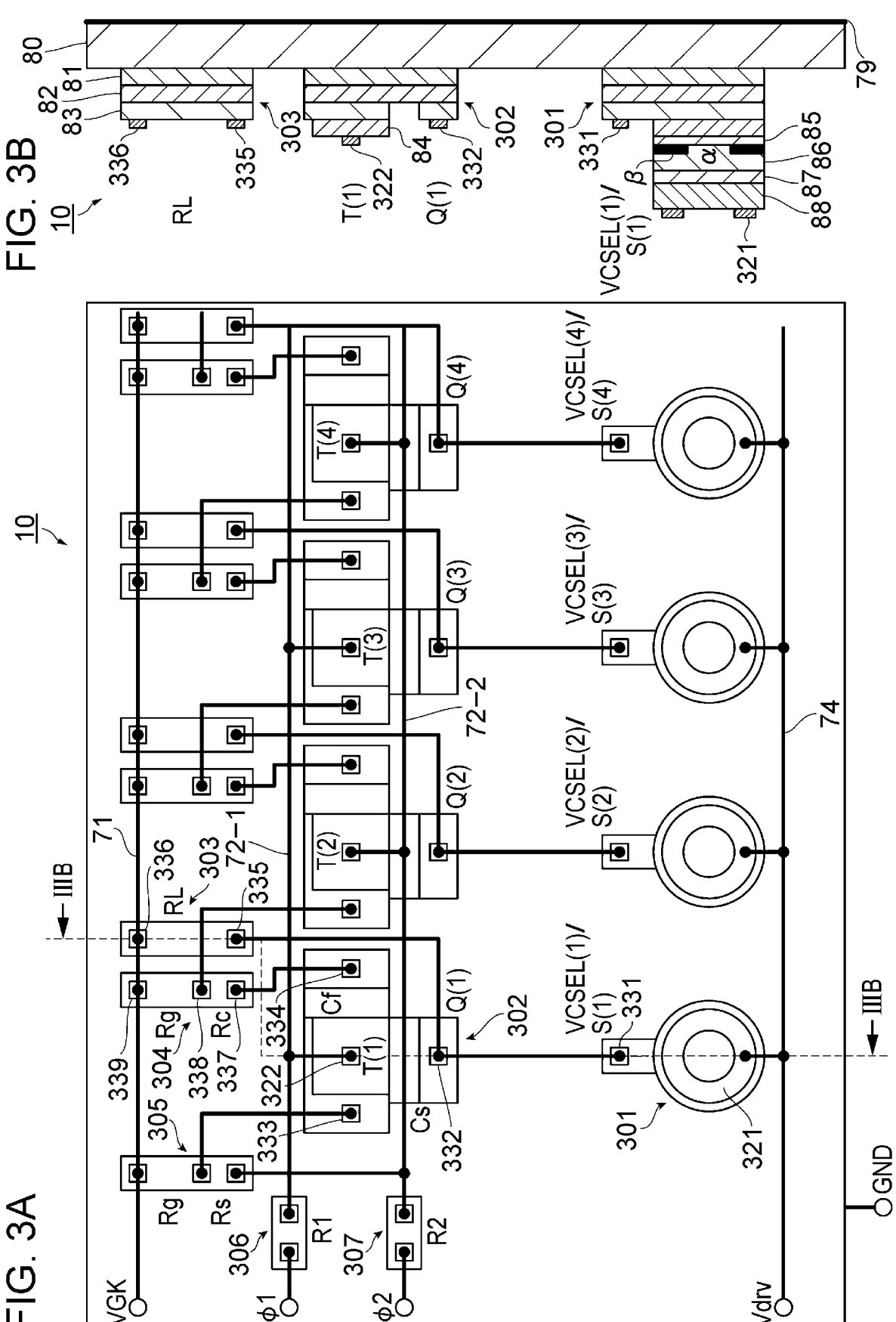
FIG. 3A illustrates the layout of the light-emitting unit.
FIG. 3B is a sectional view taken along line IIIB-IIIB in FIG. 3A.

As shown in FIG. 2B, the light-emitting unit 10 is constituted by multiple semiconductor layers stacked on each other (see FIG. 3B). FIG. 2B illustrates multilayers forming part of the light-emitting unit 10, that is, an n-type semiconductor substrate 80, an n-type semiconductor layer 81, a p-type semiconductor layer 82, an n-type semiconductor layer 83, and a p-type semiconductor layer 84 forming the shift thyristor T(1) and the coupling transistor Q(1). The shift thyristor T(1) uses the n-type semiconductor layer 81 as the cathode K, the p-type semiconductor layer 82 as the p-gate Gp, the n-type semiconductor layer 83 as the n-gate Gn, and the p-type semiconductor layer 84 as the anode A. The coupling transistor Q(1) uses the n-type semiconductor layer 81 as the emitter E, the p-type semiconductor layer 82 as the base B, and the n-type semiconductor layer 83 as the collectors Cf and Cs. The cathode K of the shift thyristor T(1) and the emitter E of the coupling transistor Q(1) are electrically connected to each other via the n-type semiconductor layer 81. Likewise, the p-gate Gp of the shift thyristor T(1) and the base B of the coupling transistor Q(1) are electrically connected to each other via the p-type semiconductor layer 82. Although the n-gate Gn of the shift thyristor T(1) and the collectors Cf and Cs of the coupling transistor Q(1) form the n-type semiconductor layer 83, they are separated from each other. The other shift thyristors T and coupling transistors Q are formed in a similar manner.

FIGS. 3A and 3B are respectively a plan view and a sectional view of the light-emitting unit 10. FIG. 3A illustrates the layout of the light-emitting unit 10. FIG. 3B is a sectional view taken along line IIIB-IIIB in FIG. 3A. In FIG. 3A, the shift thyristors T(1) through T(4), coupling transistors Q(1) through Q(4), light-emission control thyristors S(1) through S(4), and VCSEL(1) through VCSEL(4) are mainly shown. In FIG. 3B, the cross sections of the VCSEL (1), light-emission control thyristor S(1), shift thyristor T(1), coupling transistor Q(1), and power supply line resistor RL connected to the coupling transistor Q(1) are shown.

As shown in FIG. 3B, the light-emitting unit 10 is constituted by an n-type semiconductor substrate 80 and multilayers stacked on the n-type semiconductor substrate 80. The multilayers are constituted by an n-type semiconductor layer 81, a p-type semiconductor layer 82, an n-type semiconductor layer 83, a p-type semiconductor layer 84, a tunnel junction layer 85, an n-type semiconductor layer 86, an active layer 87, and a p-type semiconductor layer 88. Elements, such as the shift thyristor T, coupling transistor Q, light-emission control thyristor S, VCSEL, are constituted by plural islands, which are separated from each other by entirely or partially removing some semiconductor layers by etching. An island may also be called a mesa. Etching performed to form an island (mesa) may also be called mesa etching. Islands (islands 301 through 307) will be explained by mainly referring to the island 301 including the VCSEL (1) and the light-emission control thyristor S(1) and the island 302 including the shift thyristor T(1) and the coupling transistor Q(1).

In the island 301, the light-emission control thyristor S(1) and the VCSEL(1) are stacked on each other. The shift thyristor T(1) and the coupling transistor Q(1) shown in FIG. 2B are disposed in the island 302. The power supply line resistor RL is disposed in the island 303. The power supply line resistor Rg and the coupling resistor Rc are disposed in the island 304. The power supply line resistor Rg and the start resistor Rs are disposed in the island 305. The current limiting resistor R1 is disposed in the island 306. The current limiting resistor R2 is disposed in the island 307. A backside electrode 79 is provided on the back side of the n-type semiconductor substrate 80.

The layout and the sectional area of the light-emitting unit 10 will be discussed below with reference to FIGS. 3A and 3B.

The n-type semiconductor layer 81, p-type semiconductor layer 82, n-type semiconductor layer 83, p-type semiconductor layer 84, tunnel junction layer 85, n-type semiconductor layer 86, active layer 87, and p-type semiconductor layer 88 around the island 301 are removed by etching. A p-ohmic electrode 321, which is likely to easily ohmic-contact a p-type semiconductor layer, is provided on the p-type semiconductor layer 88. An n-ohmic electrode 331, which is likely to easily ohmic-contact an n-type semiconductor layer, is provided on the n-type semiconductor layer 83 which is exposed by removing the p-type semiconductor layer 88, active layer 87, n-type semiconductor layer 86, tunnel junction layer 85, and p-type semiconductor layer 84. The light-emission control thyristor S(1) uses the n-type semiconductor layer 81 as the cathode K, the p-type semiconductor layer 82 as the p-gate Gp (p-gate layer), the n-type semiconductor layer 83 as the n-gate Gn (n-gate layer), and the p-type semiconductor layer 84 as the anode A. The n-ohmic electrode 331 is used as the n-gate Gn of the light-emission control thyristor S(1). The VCSEL(1) uses the n-type semiconductor layer 86 as the cathode K (see FIG. 2A), the active layer 87 as an active layer, the p-type semiconductor layer 88 as the anode A.

As shown in FIG. 3B, the light-emission control thyristor S(1) is disposed on the n-type semiconductor substrate 80, and the VCSEL(1) is disposed on the light-emission control thyristor S(1) with the tunnel junction layer 85 interposed therebetween. The tunnel junction layer 85 is provided to make it difficult to cause a situation where a current does not flow between the p-type semiconductor layer 84 of the light-emission control thyristor S(1) and the n-type semiconductor layer 86 of the VCSEL(1) due to reverse biasing therebetween. The tunnel junction layer 85 is a junction between an $n^{++}$ layer highly doped with an n-type impurity and a $p^{++}$ layer highly doped with a p-type impurity. A current flows through the tunnel junction layer 85 due to the tunnel effect even when the p-type semiconductor layer 84 and the n-type semiconductor layer 86 are reverse-biased.

The island 301 is formed cylindrically, except for a region where the n-ohmic electrode 331 is provided. The p-ohmic electrode 321, which is formed in a ring-like shape, is disposed on the p-type semiconductor layer 88 of the cylindrical island 301. Part of the n-type semiconductor layer 86, which is exposed by etching, is oxidized from the peripheral portion of the cylindrical n-type semiconductor layer 86 and serves as a current blocking portion β. The current blocking portion β is formed in a ring-like shape where a current is less likely to flow. The center of the cylindrical n-type semiconductor layer 86, which is not oxidized, serves as a current passing portion α where a current is more likely to flow. Then, light is output from a portion surrounded by the ring-like p-ohmic electrode 321. The current blocking portion β is formed in the following manner. An AlAs layer or an AlGaAs layer having a high Al density is provided in the n-type semiconductor layer 86. Then, the n-type semiconductor layer 86 is oxidized from the exposed peripheral portion, that is, Al is oxidized, thereby forming the current blocking portion β. The peripheral portion of the VCSEL(1) suffers from many defects due to etching and are thus likely to cause the occurrence of non-radiative recombination. The provision of the current blocking portion β makes it less likely to consume power which would be used for non-radiative recombination, thereby enhancing power saving and light emission efficiency. The light emission efficiency is represented by the amount of light that can be emitted per unit power.

In the island 302, the p-type semiconductor layer 88, active layer 87, n-type semiconductor layer 86, and tunnel junction 85 are removed by etching. The p-type semiconductor layer 84, n-type semiconductor layer 83, p-type semiconductor layer 82, and n-type semiconductor layer 81 around the island 302 are also removed by etching. A p-ohmic electrode 322 is provided on the p-type semiconductor layer 84. The p-ohmic electrode 322 is an electrode (anode A electrode) which is connected to the anode A of the shift thyristor T(1) and which is connected to the shift signal line 72-1 to which the shift signal p1(φ1) is supplied. Three n-ohmic electrodes 332, 333, and 334 are provided on the n-type semiconductor layer 83 exposed by removing the p-type semiconductor layer 84. The n-ohmic electrode 332 is an electrode (collector Cs electrode) connected to the collector Cs of the coupling transistor Q(1). The n-ohmic electrode 334 is an electrode (collector Cf electrode) connected to the collector Cf of the coupling transistor Q(1). The n-type semiconductor layer 83 between the p-ohmic electrode 322 and the n-ohmic electrodes 332 and 334 is removed (see FIG. 2B). The n-ohmic electrode 333 is an electrode (n-gate Gn electrode) connected to the n-gate Gn of the shift thyristor T(1).

In the island 303, the p-type semiconductor layer 88, active layer 87, n-type semiconductor layer 86, and tunnel junction layer 85 are removed by etching, as in the island 302. The p-type semiconductor layer 84 is also removed to expose the n-type semiconductor layer 83. The n-type semiconductor layer 83, p-type semiconductor layer 82, and n-type semiconductor layer 81 around the island 303 are removed by etching. Two n-ohmic electrodes 335 and 336 are provided on the exposed n-type semiconductor layer 83. The n-type semiconductor layer 83 between the two n-ohmic electrodes 335 and 336 serves as the power supply line resistor RL.

The island 304 is formed similarly to the island 303. Three n-ohmic electrodes 337, 338, and 339 are provided on the n-type semiconductor layer 83 exposed by removing the p-type semiconductor layer 84. The n-type semiconductor layer 83 between the n-ohmic electrodes 337 and 338 serves as the coupling resistor Rc, while the n-type semiconductor layer 83 between the n-ohmic electrodes 338 and 339 serves as the power supply line resistor Rg.

The island 305 is formed similarly to the island 304. The start resistor Rs and the power supply line resistor Rg are disposed in the island 305. The islands 306 and 307 are formed similarly to the island 303. The current limiting resistors R1 and R2 are respectively disposed in the islands 306 and 307.

The connection relationship between the elements and lines in the light-emitting unit 10 will be discussed below. In FIG. 3A, lines (power supply line 71, shift signal lines 72-1 and 72-2, and light-emitting potential line 74) used for connecting elements in the light-emitting unit 10 are indicated by the thick straight lines.

The p-ohmic electrode 321 in the island 301, which is the anode A electrode of the VCSEL(1), is connected to the light-emitting potential line 74 to which a light-emitting current is supplied. The n-ohmic electrode 331 in the island 301, which is the n-gate Gn of the light-emission control thyristor S(1), is connected to the n-ohmic electrode 332 in the island 302, which is the collector Cs electrode of the coupling transistor Q(1). The n-ohmic electrode 332 is connected to the n-ohmic electrode 335, which is one of the n-ohmic electrodes corresponding to the power supply line resistor RL, in the island 303. The n-ohmic electrode 336, which is the other n-ohmic electrode, in the island 303 is connected to the power supply line 71 to which the power supply potential VGK is supplied.

The p-ohmic electrode 322 in the island 302, which is the anode A electrode of the shift thyristor T(1), is connected to the shift signal line 72-1. The shift signal line 72-1 is connected, via the current limiting resistor R1 in the island 306, to the φ1 terminal to which the shift signal p1 is supplied. The n-ohmic electrode 333 in the island 302, which is the n-gate Gn electrode of the shift thyristor T(1), is connected to an n-ohmic electrode, which is a node between the power supply line resistor Rg and the start resistor Rs, in the island 305. The n-ohmic electrode 334 in the island 302, which is the collector Cf electrode of the coupling transistor Q(1), is connected to the n-ohmic electrode 337 in the island 304, which is one of the n-ohmic electrodes corresponding to the coupling resistor Rc.

The n-ohmic electrode 338 in the island 304, which is the other one of the n-ohmic electrodes corresponding to the coupling resistor Rc, is connected to an n-ohmic electrode, which is the n-gate Gn electrode of the shift thyristor T(2). The n-ohmic electrode 339 in the island 304, which is the other one of the n-ohmic electrodes corresponding to the power supply line resistor Rg, is connected to the power supply line 71.

One of the n-ohmic electrodes corresponding to the start resistor Rs in the island 305 is connected to the shift signal line 72-2. The other one of the n-ohmic electrodes corresponding to the power supply line resistor Rg in the island 305 is connected to the power supply line 71. The shift signal line 72-2 is connected, via the current limiting resistor R2 in the island 307, to the φ2 terminal to which the shift signal p2(φ2) is supplied.

The shift signal line 72-1 is connected to the p-ohmic electrodes, which are the anode A electrodes of the odd-numbered shift thyristors T. The shift signal line 72-2 is connected to the p-ohmic electrodes, which are the anode A electrodes of the even-numbered shift thyristors T. The back-side electrode 79 disposed on the back side of the n-type semiconductor substrate 80 is set at the ground potential GND.

The other shift thyristors T, coupling transistors Q, light-emission control thyristors S, and VCSELs are formed similarly to the shift thyristor T(1), coupling transistor Q(1), light-emission control thyristor S(1), and VCSEL(1), respectively.

As discussed above, the light-emitting unit 10 is disposed on the semiconductor substrate 80 constituted by one semiconductor.

Figure 4:
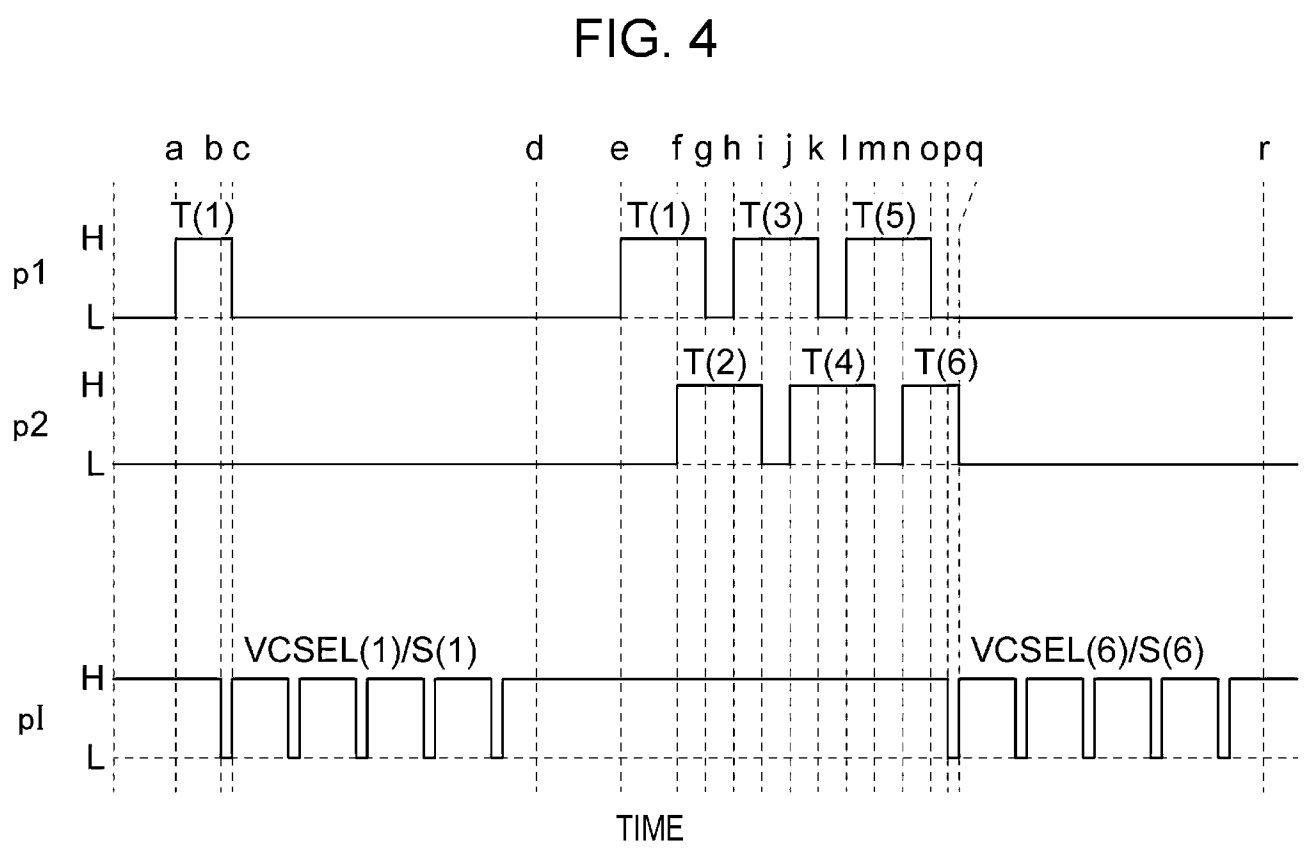

FIG. 4 is a timing chart illustrating the operation of the light source device 1 according to the first exemplary embodiment. The horizontal axis indicates the time, and the time elapses from time a to time r in alphabetical order. In FIG. 4, a temporal change in each of the shift signals p1 and p2 and the light-emitting signal pI is shown, and the shift thyristor T, the light-emission control thyristor S, and the VCSEL which are turned ON are each indicated by its alphabetical character and number. A set of the VCSEL and the light-emission control thyristor S is represented by VCSEL/S.

In this example, among the VCSEL(1) through the VCSEL(6) of the light-emitting unit 10 shown in FIG. 1, the VCSEL(1) and VCSEL(6) are caused to emit light. After the light-emitting unit 10 has caused the VCSEL(1) to emit light from the initial state, it returns to the initial state and then causes the VCSEL(6) to emit light. In this manner, the light-emitting unit 10 causes the VCSEL(1) and the VCSEL(6) to intermittently emit light multiple times (five times in FIG. 4). An individual intermittent light-emission period will be called a light-emitting pulse. With this configuration, a desirable VCSEL can be selected and be caused to emit light. In other words, VCSELs can be caused to emit light randomly.

As discussed above with reference to FIG. 2A, the VCSEL(1) emits light as a result of the shift thyristor T(1) being turned ON, while the VCSEL(6) emits light as a result of the shift thyristor T(6) being turned ON. That is, the shift thyristor T is turned ON to set a VCSEL which is to emit light.

The timing chart of FIG. 4 will be explained below by referring to FIG. 1.

Before time a, the light-emitting unit 10 is in the initial state. The initial state is a state in which the power supply line 71 is at the power supply potential VGK (7 V), the ground line 73 is at the ground potential GND (0 V), the shift signals p1(φ1) and p2(φ2) are at "L" (0 V), the light-emitting signal pI is at "H" (7 V), and the driver Dry is OFF. The light-emitting power supply potential VS2 is not applied to the light-emitting potential line 74. In the initial state, the shift thyristor T(1) is in a state in which it can shift to the ON state.

At time a, the shift signal p1 is changed from "L" (0 V) to "H" (7 V). Then, the shift thyristor T(1) is turned ON. Then, the VCSEL(1) enters a state in which it can emit light.

At time b, the light-emitting signal pI is changed from "H" (7 V) to "L" (0 V). Then, the driver Dry is changed from OFF to ON and the VCSEL(1) emits light.

At time c, the shift signal p1 is changed from "H" (7 V) to "L" (0 V). Then, the shift thyristor T(1) is turned OFF and shifts from the ON state to the OFF state.

At time c, the light-emitting signal pI is changed from "L" (0 V) to "H" (7 V). Then, the VCSEL(1) stops emitting light.

Thereafter, during the period from time c to time d, the light-emitting signal pI is switched from "H" (7 V) to "L" (0 V) and from "L" (0 V) to "H" (7 V) four times, thereby causing the VCSEL(1) to emit light four times.

During the period from time c to time d, the shift signal p1(ϕ1) is at "L" (0 V), the shift thyristor T(1) is OFF, and no current flows through the shift thyristor T(1). The states of the other shift thyristors T are similar to that of the shift thyristor T(1). Power is thus less likely to be consumed in the shifter 12 (see FIG. 1).

At time d, the initial state is resumed. At this time, the shift thyristor T(1) is in a state in which it can shift to the ON state.

At time e, the shift signal p1 is changed from "L" (0 V) to "H" (7 V). Then, as in time a, the shift thyristor T(1) is turned ON.

At time f, the shift signal p2 is changed from "L" (0 V) to "H" (7 V). Then, the shift thyristor T(2) is turned ON.

At time g, the shift signal p1 is changed from "H" (7 V) to "L" (0 V). Then, the shift thyristor T(1) is turned OFF.

Then, at time h, the shift thyristor T(3) is turned ON, and, at time i, the shift thyristor T(2) is turned OFF. Then, at time j, the shift thyristor T(4) is turned ON, and, at time k, the shift thyristor T(3) is turned OFF. Then, at time l, the shift thyristor T(5) is turned ON, and, at time m, the shift thyristor T(4) is turned OFF. Then, at time n, the shift thyristor T(6) is turned ON, and, at time o, the shift thyristor T(5) is turned OFF. At this time, the VCSEL(6) enters a state in which it can emit light.

At time p, the light-emitting signal pI is changed from "H" (7 V) to "L" (0 V). Then, the driver Dry is changed from OFF to ON, and the VCSEL(6) emits light, as the VCSEL(1) emits light in time b.

At time q, the shift signal p2 is changed from "H" (7 V) to "L" (0 V). Then, the shift thyristor T(6) is turned OFF.

At time q, the light-emitting signal pI is changed from "L" (0 V) to "H" (7 V). Then, the VCSEL(6) stops emitting light.

Thereafter, during the period from time q to time r, the light-emitting signal pI is switched from "H" (7 V) to "L" (0 V) and from "L" (0 V) to "H" (7 V) four times, thereby causing the VCSEL(6) to emit light four times.

During the period from time q to time r, the shift signal p2(ϕ2) is at "L" (0 V), the shift thyristor T(6) is OFF, and no current flows through the shift thyristor T(6). The states of the other shift thyristors T are similar to that of the shift thyristor T(6). Power is thus less likely to be consumed in the shifter 12 (see FIG. 1).

As described above, between two adjacent shift thyristors T, the shifter 12 turns ON the shift thyristor T on the upstream side in the shifting direction and then turns ON the shift thyristor T on the downstream side in the shifting direction. Then, the shifter 12 turns OFF the shift thyristor T on the upstream side. In this manner, based on the shift signals (shift signals p1 and p2) out of phase by 180 degrees, the ON state is sequentially shifted among the shift thyristors T in the shifter 12, that is, the above-described shift operation is performed. During the shift operation based on the shift signals p1 and p2, there is a period (from time f to time g, for example) for which two adjacent shift thyristors T are ON at the same time. Forming the shifter 12 by using the shift thyristors T makes it easy to shift the ON state.

At time c, the shift signal p1 is changed to "L" (0 V), and at time q, the shift signal p2 is changed to "L" (0 V), thereby reliably turning OFF the shifter 12. That is, by setting the shift signals p1 and p2 to be at the ground potential, the shifter 12 can be easily turned OFF.

The period from time a to time d is a cycle for which the VCSEL(1) is caused to emit light. The period from time e to time r is a cycle for which the VCSEL(6) is caused to emit light. In this example, one VCSEL is caused to emit light during one cycle. After the cycle (from time a to time d) for which the VCSEL(1) emits light has finished, the cycle for which the VCSEL(6) emits light is immediately started. In this manner, if the shifter 12 is turned OFF before all the shift thyristors T in the shifter 12 have finished shifting, the time taken to set a VCSEL to emit light is decreased. In FIG. 4, the shift thyristor T(1) is turned OFF during the cycle for which the VCSEL(1) emits light. However, the shift thyristor T(1) may be turned OFF at any timing if it is before all the shift thyristors T have finished shifting, and more specifically, before the shift thyristor T(6) has finished shifting. For example, the shifter 12 may be turned OFF at any timing if it is possible to reduce an even small amount of time and power for shifting the shift thyristor T between time d after the VCSEL(1) has finished emitting light and time e at the start of the cycle for which the VCSEL(6) is caused to emit light. For instance, the shifter 12 may be turned OFF after the shift thyristors T(2) and T(3) are turned ON, though it is not shown. In this case, however, the voltage at the n-gate Gn of the light-emission control thyristor S(3) may become lower than that of the light-emission control thyristor S(1) depending on the timing at which the light-emitting signal pI is supplied. Then, a set of the VCSEL(3) and the light-emission control thyristor S(3) is turned ON. It may be thus desirable that the shifter 12 (shift thyristor T(1) in this example) be turned OFF immediately after the VCSEL(1) starts emitting light.

Figure 5:
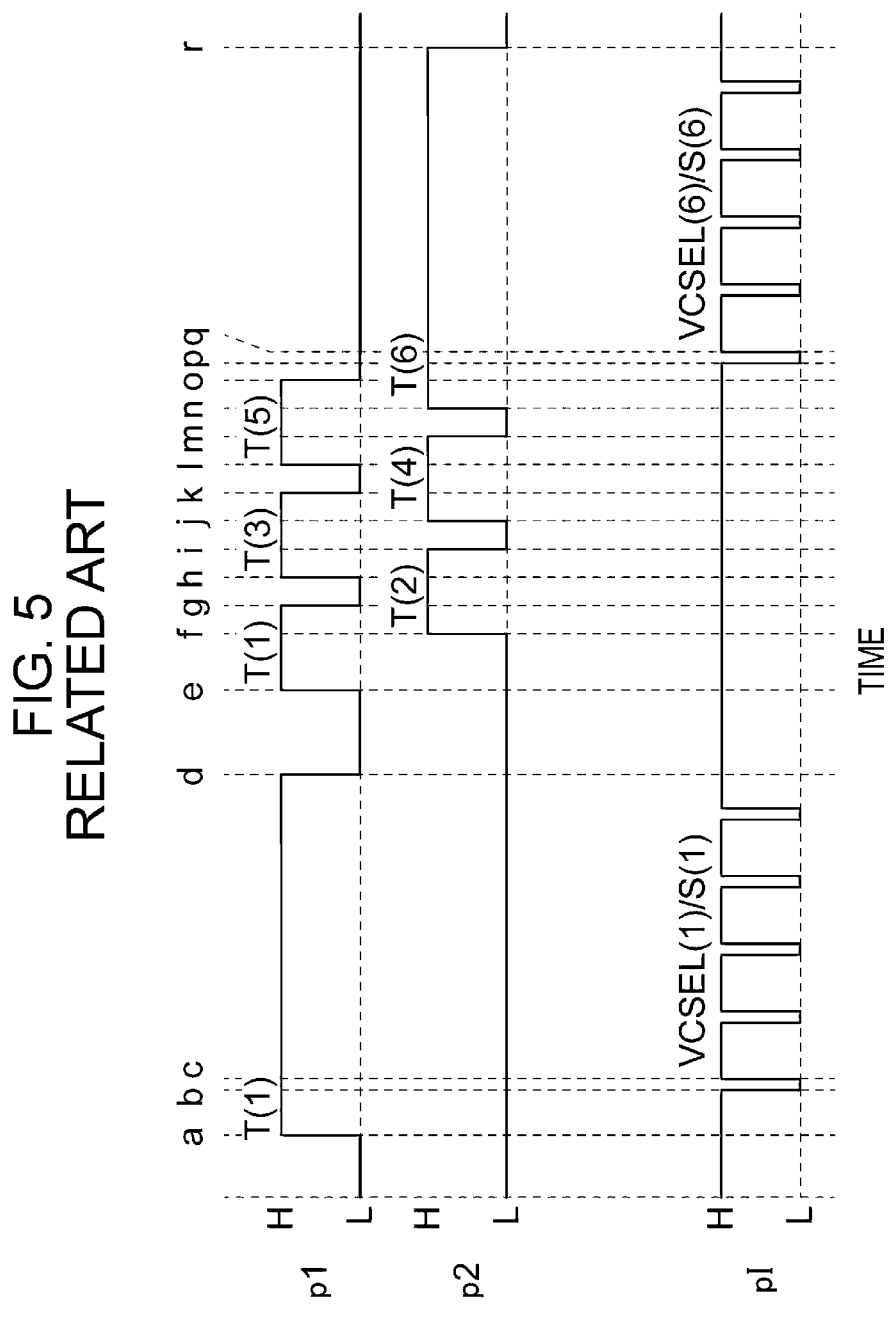
FIG. 5 is a timing chart illustrating the operation of a light source device to which the first exemplary embodiment is not applied.

FIG. 5 is a timing chart illustrating the operation of the light source device 1 to which the first exemplary embodiment is not applied, that is, the operation of the related art. The same light-emitting unit 10 of the first exemplary embodiment is used. The horizontal axis indicates the time, as in FIG. 4.

In the related art in FIG. 5, the ON state of the shift thyristor T(1) is maintained during the period from time c to time d for which the light emission of the VCSEL(1) is intermittently repeated. Likewise, the ON state of the shift thyristor T(6) is maintained during the period from time q to time r for which the light emission of the VCSEL(6) is intermittently repeated. During these periods, a current for maintaining the ON state continues to flow through the shift thyristor T(1) or T(6). Hence, more power is consumed by the operation of the related art than that by the operation of the light source device 1 illustrated in FIG. 4.

When the duty cycle of the light-emitting pulses is as small as several percentage points, as shown in FIGS. 4 and 5, if the shifter 12 is kept ON during the period from time c to d and the period from q to r, as shown in FIG. 5, the ratio of power consumed in the shifter 12 to that in the light-emitting section 11 is increased. In light of this, the shifter 12 is turned OFF during the period from time c to d and the period from q to r in FIG. 4, thereby reducing power consumed in the shifter 12.

As discussed with reference to FIG. 4, the VCSEL is caused to intermittently emit light during a period for which the shift thyristor T is in the OFF state (period from time c to time d in FIG. 4, for example). This will be explained below.

Figure 6A:
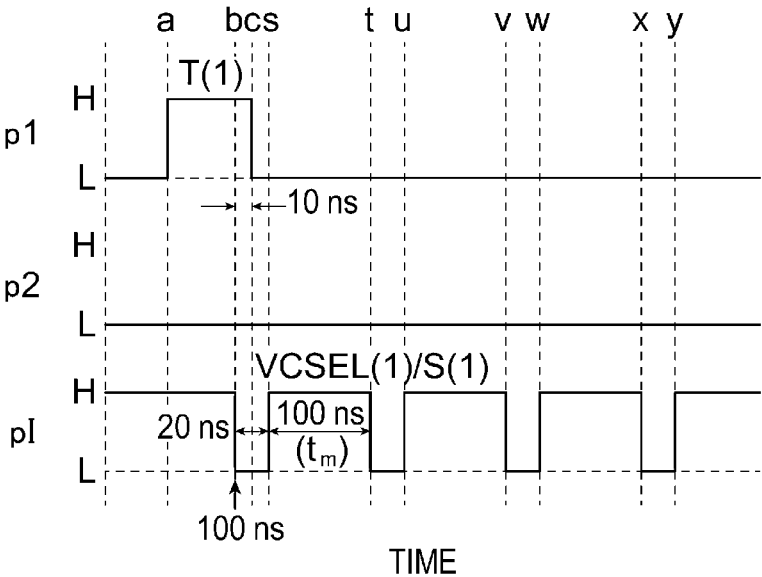
FIG. 6A is a timing chart for explaining an intermittent light-emitting operation of a VCSEL.
Figure 6B:
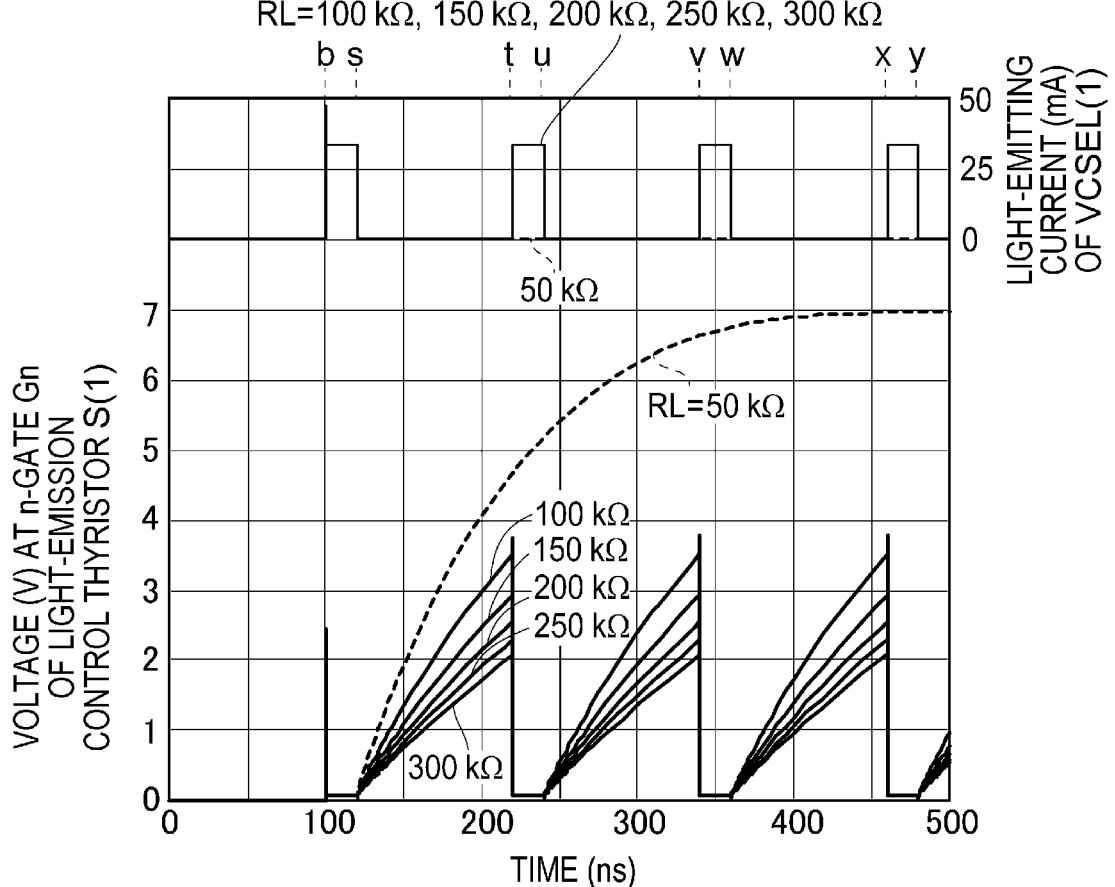
FIG. 6B illustrates simulation results of the voltage at the n-gate of a light-emission control thyristor and the light-emitting current of a VCSEL connected in series with each other when the light-emitting operation is performed in accordance with the timing chart of FIG. 6A.

FIG. 6A is a timing chart, which is part of the timing chart starting from time a in FIG. 4. FIG. 6B illustrates simulation results of the voltage at the n-gate Gn of the light-emission control thyristor S(1) and the light-emitting current of the VCSEL(1). The light-emission control thyristor S(1) and the VCSEL(1) are connected in series with each other. In FIG. 6A, time s to time y are added to the period from time c to time d (see FIG. 4) in alphabetical order. In FIG. 6B, the horizontal axis indicates the time (ns). The left vertical axis indicates the voltages (V) at the n-gate Gn of the light-emission control thyristor S(1). The right vertical axis indicates the light-emitting current (mA) of the VCSEL(1).

The timing chart of FIG. 6A will be explained below.

At time a, the shift signal p1 is changed from "L" (0 V) to "H" (7 V) and the shift thyristor T(1) is turned ON. At time b, the light-emitting signal pI is changed from "H" (7 V) to "L" (0 V) and the VCSEL(1) starts to emit light. This time, that is, time b, corresponds to 100 ns on the time axis in FIG. 6B. After the lapse of 10 ns from time b, at time c, the shift signal p1 is changed from "H" (7 V) to "L" (0 V) and the shift thyristor T(1) is turned OFF. After the lapse of 10 ns from time c, at time s, the light-emitting signal pI is changed from "L" (0 V) to "H" (7 V) and the VCSEL(1) stops emitting light. The VCSEL(1) is OFF for 100 ns from time s. Then, at time t, the light-emitting signal pI is changed from "H" (7 V) to "L" (0 V) again and the VCSEL(1) starts to reemit light. Thereafter, the switching of the light-emitting signal pI between "H" (7 V) and "L" (0 V) as in the period from time b to time t is repeated. That is, the VCSEL(1) emits light for 20 ns from time b, which corresponds to 100 ns, and then stops emitting light for 100 ns, and then reemits light for 20 ns. In this manner, the VCSEL(1) repeatedly reemits light at the equal time intervals. Light emission from time b is first light emission, light emission from time t is second light emission, light emission from time v is third light emission, and light emission from time x is fourth light emission.

FIG. 6B illustrates simulation results obtained under the conditions that the voltages and resistance of elements shown in FIG. 1 are as follows: the light-emitting current limiting resistor RI is 100Ω, the power supply potential VGK supplied from the power source VS1 and the light-emitting power supply potential VS2 supplied from the power source VS2 are 7 V, and the resistance of the power supply line resistor RL is varied to 50 kΩ, 100 kΩ, 150 kΩ, 200 kΩ, 250 kΩ, and 300 kΩ.

Regardless of the resistance value of the power supply line resistor RL, the first light emission from time b is observed. When the power supply line resistor RL is 50 kΩ, the second light emission from time t is not observed. In contrast, when the power supply line resistor RL is any of 100 kΩ, 150 kΩ, 200 kΩ, 250 kΩ, and 300 kΩ, the second light emission from time t is observed.

As shown in FIG. 6B, when the VCSEL(1) starts emitting light at time b, the n-gate Gn of the light-emission control thyristor S(1) drops to almost 0 V. When the VCSEL(1) stops emitting light, a current no longer flows through the series-connected light-emission control thyristor S(1) and VCSEL(1). The voltage at the n-gate Gn rises toward power supply potential VGK (7 V) since the n-gate Gn is connected via the power supply line resistor RL to the power supply line 71 to which the power supply potential VGK is supplied.

At a timing at which the VCSEL(1) reemits light (time t, v, and x, for example), if the voltage difference between the voltage at the n-gate Gn of the light-emission control thyristor S(1) and the light-emitting power supply potential VS2 is greater than or equal to the voltage at which the pn junction between the anode A and the n-gate Gn of the light-emission control thyristor S(1) and the pn junction of the VCSEL(1) are both forward-biased, that is, $2 \times Vd$ ($2 \times$forward voltage=3 V), the VCSEL(1) can reemit light. When the light-emitting power supply potential VS2 is 7 V, if the voltage at the n-gate Gn is 4 V or lower, the VCSEL(1) becomes able to reemit light. Conversely, if the above-described voltage difference is smaller than the voltage at which the pn junction between the anode A and the n-gate Gn of the light-emission control thyristor S(1) and the pn junction of the VCSEL(1) are both forward-biased, that is, if the voltage difference is smaller than 3V, the VCSEL(1) does not reemit light (VCSEL(1) becomes unable to reemit light). When the light-emitting power supply potential VS2 is 7 V, if the voltage at the n-gate Gn exceeds 4 V, the VCSEL(1) becomes unable to reemit light.

As shown in FIG. 6B, when the power supply line resistor RL is any of 100 kΩ, 150 kΩ, 200 kΩ, 250 kΩ, and 300 kΩ, at the timing of the second light emission, that is, at time t, the voltage at the n-gate Gn of the light-emission control thyristor S(1) is 3.8 V or lower, which is smaller than 4 V. The VCSEL(1) is thus able to reemit light.

In contrast, when the power supply line resistor RL is 50 kΩ, the voltage at the n-gate Gn of the light-emission control thyristor S(1) is 4.6 V, which exceeds 4 V. The VCSEL(1) is thus unable to reemit light.

When the VCSEL is able to reemit light, the period from when the VCSEL stops emitting light until when the VCSEL starts reemitting light is the period $t_m$ for which the VCSEL is ready to reemit light (the period from time s to time t, for example). When the power supply line resistor RL is any of 100 kΩ or higher, for example, the period for which the VCSEL is ready to reemit light is 100 ns, as shown in FIG. 6B. The period from when the VCSEL stops emitting light until when the above-described voltage difference becomes higher than or equal to the voltage at which the pn junction between the anode A and the n-gate Gn of the light-emission control thyristor S and the pn junction of the VCSEL are both forward-biased, that is, until when the voltage difference becomes higher than or equal to $2 \times Vd$ ($2 \times$forward voltage), is the maximum period $t_{m\_max}$ of the period $t_m$. The period $t_m$ may desirably be set to be shorter than the maximum period $t_{m\_max}$ To put it another way, if the period $t_m$ exceeds the maximum period $t_{m\_max}$, such an excess period is a period for which the VCSEL is unable to reemit light. The period $t_m$ for which the VCSEL is ready to reemit light may desirably be set to be shorter than a period for which the VCSEL is unable to reemit light. With this setting, the VCSEL can reliably reemit light.

A change in the voltage at the n-gate Gn of the light-emission control thyristor S is determined by a time constant, which is the product of the resistance of the power supply line resistor RL and the parasitic capacitance between the n-gate Gn and the cathode K of the light-emission control thyristor S. If it is desired to extend the period $t_m$ for which the VCSEL is ready to reemit light, the period $t_m$ can be adjusted by increasing the voltage of the power sources VS1 and VS2, raising the resistance of the power supply line resistor RL, and/or increasing the parasitic capacitance between the n-gate Gn and the cathode K of the light-emission control thyristor S.

It may be desirable that the period $t_m$ for which the VCSEL is ready to reemit light be set to be 10 to 80% of the maximum period $t_{m\_max}$ If the period $t_m$ is set to be shorter than the maximum period $t_{m\_max}$, the period for which the VCSEL is unable to reemit light becomes longer than the interval between light-emitting pulses. If the period $t_m$ is set to be longer than the maximum period $t_{m\_max}$, the actual time of the period for which the VCSEL is unable to reemit light becomes longer.

In FIG. 6A, the shift thyristor T(1) of the shifter 12 is turned OFF at time c after time a at which the VCSEL(1) becomes able to emit light and before time s at which the VCSEL(1) stops emitting light. This makes it possible to reliably set the VCSEL to a state in which it is ready to reemit light. The shift thyristor T(1) of the shifter 12 is turned OFF after time a at which the VCSEL(1) becomes able to emit light, and more desirably, after time b at which the VCSEL(1) starts emitting light. This encourages a light-emitting current to flow through the light-emission control thyristor S corresponding to the VCSEL which is to reemit light, thereby making it more likely to maintain the ON state of the light-emission control thyristor S.

To cause the VCSEL to repeatedly emit light without maintaining the ON state of the shift thyristor T, the light-emission control thyristor S is required to maintain the state in which the VCSEL can emit light without turning ON the shift thyristor T (coupling transistor Q). In other words, it is necessary that the light-emission control thyristor S be sufficiently charged. To meet this requirement, the period for which the shift thyristor T is in the ON state may be set to be longer than the length of the light-emitting pulse.

Second Exemplary Embodiment

In the light source device 1 according to the first exemplary embodiment, to extend the period $t_m$ for which the VCSEL is ready to reemit light, certain measures are taken, such as raising the resistance of the power supply line resistor RL. With these approaches, however, the period $t_m$ may not be sufficiently increased. In a light source device 2 according to a second exemplary embodiment, the period $t_m$ is made longer without employing these approaches.

Figure 7:
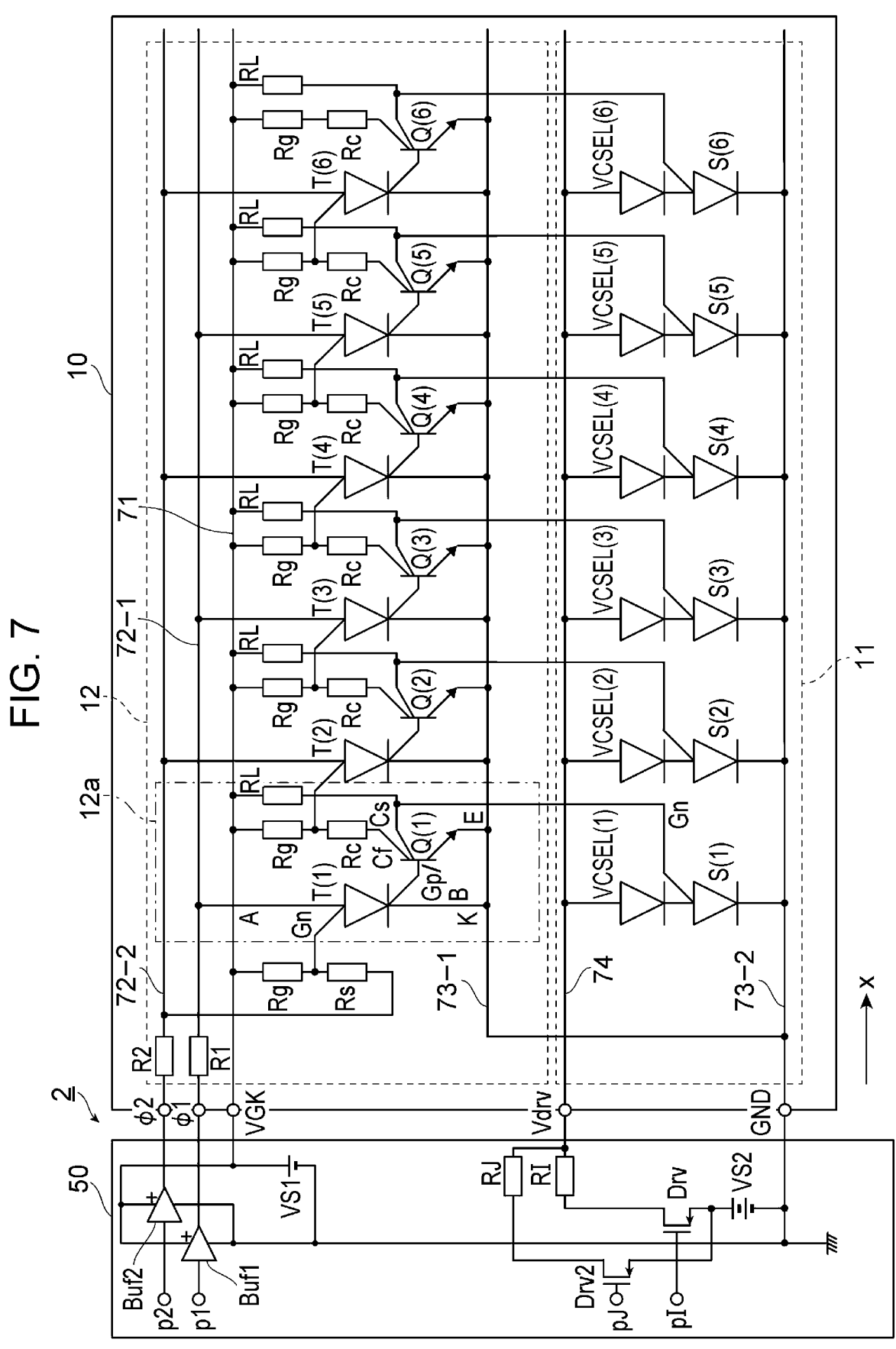
FIG. 7 illustrates a light source device according to a second exemplary embodiment.

FIG. 7 illustrates the light source device 2 according to the second exemplary embodiment. In FIG. 7, the right-side direction in the plane of the drawing is set to be a +x direction.

The light source device 2 includes a light-emitting unit 10 and a controller 50. The controller 50 of the light source device 2 includes a driver Drv2 and a holding current limiting resistor RJ, in addition to the elements provided in the controller 50 of the light source device 1 shown in FIG. 1. The driver Dr2 uses a PMOS transistor, for example, as a driver element and is turned ON/OFF by a holding signal pJ applied to the gate of the PMOS transistor. The source of the PMOS transistor used as the driver Drv2 is connected to the power source VS2, and the drain thereof is connected to the Vdrv terminal via the holding current limiting resistor RJ. It is assumed that the holding signal pJ is a signal having a ground potential GND ("L" (0 V)) and a power supply potential VGK ("H" (7 V)). It is also assumed that the driver Drv2 is turned OFF when the holding signal pJ is at "H" (7 V) and is turned ON when the holding signal pJ is at "L" (0 V). During the period for which the driver Drv2 is ON, a holding pulse, which will be discussed below, is supplied to the light-emitting potential line 74.

Figure 8A:
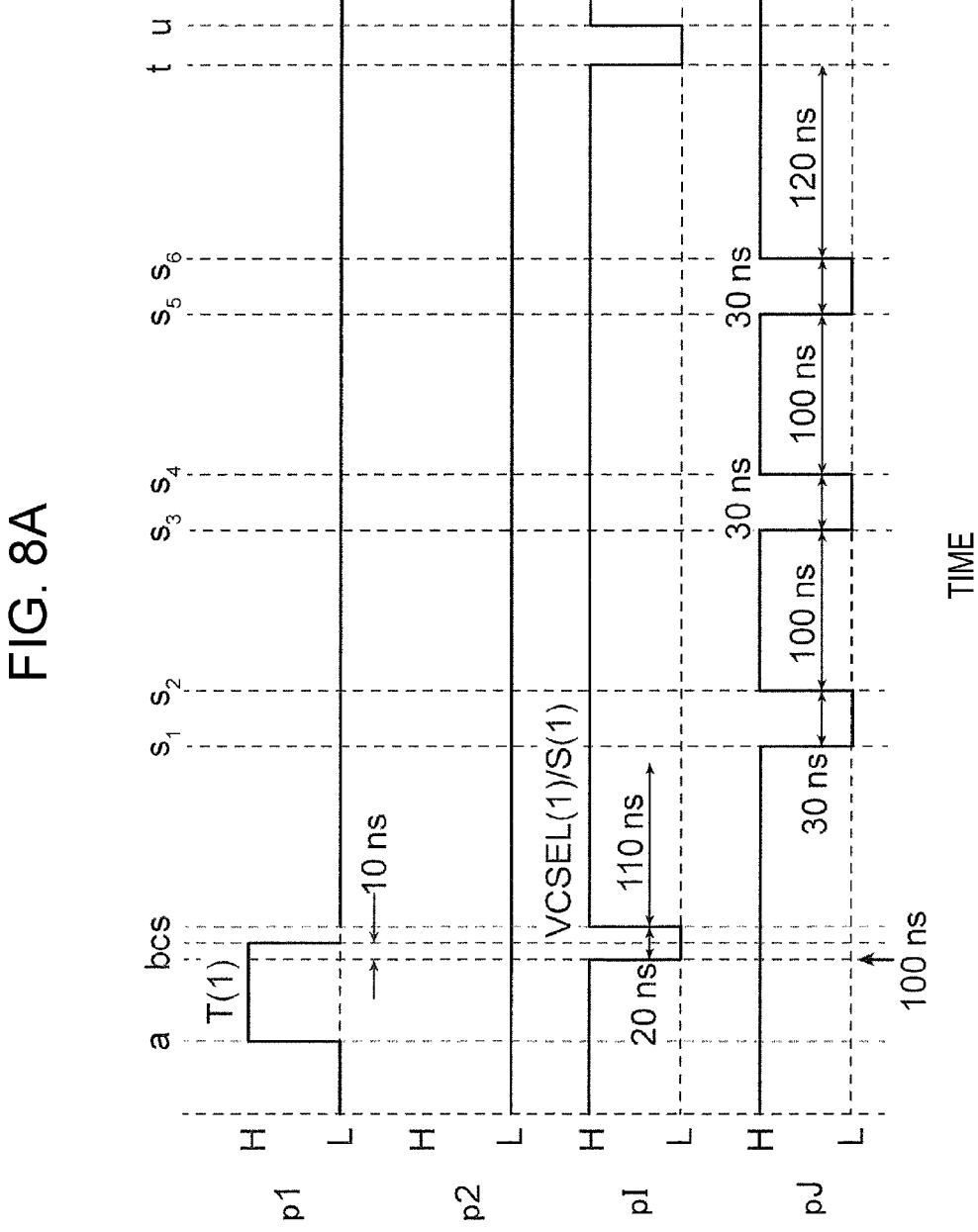
FIG. 8A is a timing chart for explaining holding pulses.
Figure 8B:
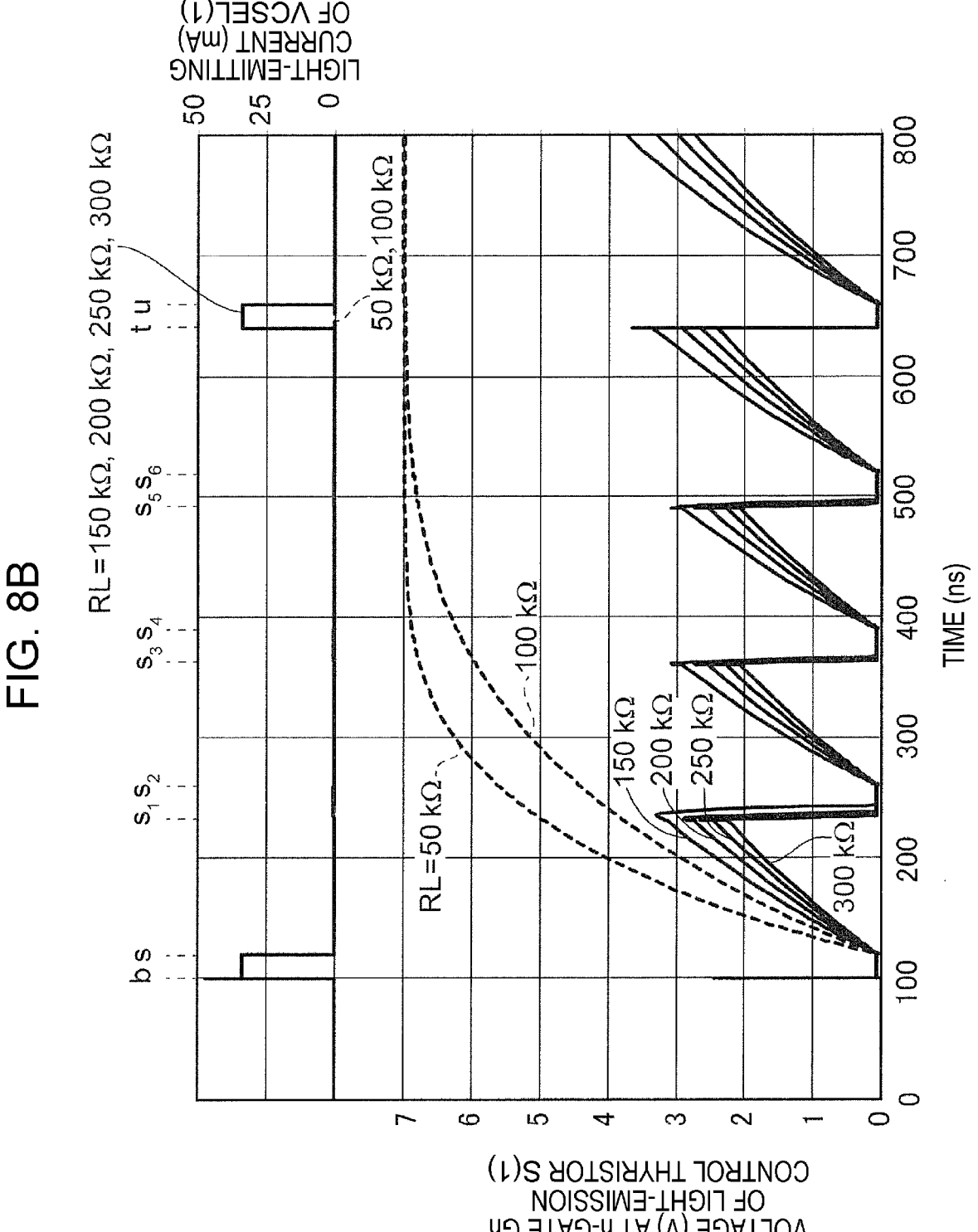
FIG. 8B illustrates simulation results of the voltage at the n-gate of a light-emission control thyristor and the light-emitting current of a VCSEL connected in series with each other when the light-emitting operation is performed in accordance with the timing chart of FIG. 8A.

FIGS. 8A and 8B are diagrams for explaining a holding pulse. FIG. 8A is a timing chart for explaining the operation of the light source device 2. FIG. 8B illustrates simulation results of the voltage at the n-gate Gn of the light-emission control thyristor S(1) and the light-emitting current of the VCSEL(1). In FIG. 8A, three holding pulses are added during the period from time s to time t in the timing chart of FIG. 6A. Time $s_1$ through time $s_6$ are thus added to the period from time s to time t.

In FIG. 8A, at time s, the light-emitting signal pI is changed from "L" (0 V) to "H" (7 V) to cause the VCSEL(1) to stop emitting light. After the lapse of 110 ns, at time $s_1$, the holding signal pJ is changed from "H" (7 V) to "L" (0 V) to turn ON the driver Drv2. Then, after the lapse of 30 ns, at time $s_2$, the holding signal pJ is changed from "L" (0 V) to "H" (7 V) to turn OFF the driver Drv2. The period between time $s_1$ and time $s_2$ is the period of a holding pulse.

Then, after the lapse of 100 ns, at time $s_3$, the holding signal pJ is changed from "H" (7 V) to "L" (0 V), and after the lapse of 30 ns, at time $s_4$, the holding signal pJ is changed from "L" (0 V) to "H" (7 V). Then, after the lapse of 100 ns, at time $s_5$, the holding signal pJ is changed from "H" (7 V) to "L" (0 V), and after the lapse of 30 ns, at time $s_6$, the holding signal pJ is changed from "L" (0 V) to "H" (7 V). That is, during the period from $s_3$ to time $s_4$ and the period from $s_5$ to time $s_6$, the driver Drv2 is turned ON to generate holding pulses. From time s to time t, three holding pulses are generated.

After the lapse of 120 ns from time $s_6$, at time t, the light-emitting signal pI is changed from "H" (7 V) to "L" (0 V) again to cause the VCSEL(1) to emit light, as in time t in FIG. 6A.

The simulation results of the voltage at the n-gate Gn of the light-emission control thyristor S(1) and the light-emitting current of the VCSEL(1) shown in FIG. 8B are obtained when the holding current limiting resistor RJ is set to 10 kΩ and the power supply line resistor RL is varied to 50 kΩ, 100 kΩ, 150 kΩ, 200 kΩ, 250 kΩ, and 300 kΩ. At time $s_1$, when the power supply line resistor RL is either one of 50 kΩ and 100 kΩ, the voltage at the n-gate Gn exceeds 4 V. Accordingly, the light-emission control thyristor S(1) is not turned ON, and the VCSEL(1) does not reemit light at time $s_1$. In contrast, at time $s_1$, when the power supply line resistor RL is any of 150 kΩ, 200 kΩ, 250 kΩ, and 300 kΩ, the voltage at the n-gate Gn is 4 V or lower. Accordingly, the light-emission control thyristor S(1) is turned ON and the VCSEL (1) reemits light. As shown in FIG. 8B, the light-emitting current of the VCSEL(1) during the period of the holding pulse is smaller than that of the light-emitting pulses during the period for which the light-emitting signal pI is at "L" (0 V). The light-emitting current of the VCSEL(1) during the period of the holding pulse is 0.4 mA. The reason for this is that the holding current limiting resistor RJ is set to 10 kΩ, which is 100 times as high as that (100Ω) of the light-emitting current limiting resistor RI, so as to suppress the light emission of the VCSEL(1). That is, the holding pulse resets and extends the period for which the VCSEL(1) is ready to reemit light while suppressing the light emission of the VCSEL(1). As a result, the period for which the VCSEL (1) is ready to reemit light is increased to 520 ns, which is longer than 100 ns in a case in which no holding pulse is used. Since the holding current limiting resistor RJ is set to 10 kΩ, which is much higher than 100Ω of the light-emitting current limiting resistor RI, it takes more time to turn ON the light-emission control thyristor S(1). Hence, the period of the holding pulse (from time $s_1$ to time $s_2$, for example) is set to 30 ns. If the resistance of the holding current limiting resistor RJ is set to be excessively high, the time at which the light-emission control thyristor S(1) is turned ON may be delayed or the ON state of the light-emission control thyristor S(1) may not be maintained. If the resistance of the holding current limiting resistor RJ is set to be too low, more power is consumed. It is thus necessary to set the resistance of the holding current limiting resistor RJ to a suitable value. If it is not desired that the VCSEL emit light by the holding pulse, the current value may be adjusted to be lower than or equal to the threshold current of the VCSEL.

Although three holding pulses are inserted between light-emitting pulses in the example in FIGS. 8A and 8B, any desired number of holding pulses may be provided. Using the holding pulse can maintain the state in which the VCSEL can reemit light. That is, the holding pulse enables the VCSEL which is to reemit light to maintain ON information.

Third Exemplary Embodiment

In the first exemplary embodiment, after a certain VCSEL is caused to emit light, even when the next VCSEL to emit light is located on the downstream side in the shifting direction, the shift operation is restarted from the first shift thyristor T on the upstream side in the shifting direction to cause the next VCSEL to emit light. There may be a case in which, after a certain VCSEL is caused to emit light, a VCSEL located on the downstream side of the shifter 12 is to sequentially emit light. An example of such a case is that, after the even-numbered VCSEL(2), VCSEL(4), VCSEL(6), and VCSEL(8) are caused to emit light in this order, the odd-numbered VCSEL(1), VCSEL(3), VCSEL(5), and VCSEL(7) are caused to emit light in this order. In this manner, there are many cases in which, after a certain VCSEL is caused to emit light, the next VCSEL located on the downstream side is to emit light. In a third exemplary embodiment, after the shift thyristor T corresponding to a VCSEL which is caused to emit light is turned ON, it is not completely turned OFF, and is then turned ON again to restart the shift operation from this shift thyristor T. With this operation, the time taken to set the next VCSEL is reduced.

Figures 9A, 9B:
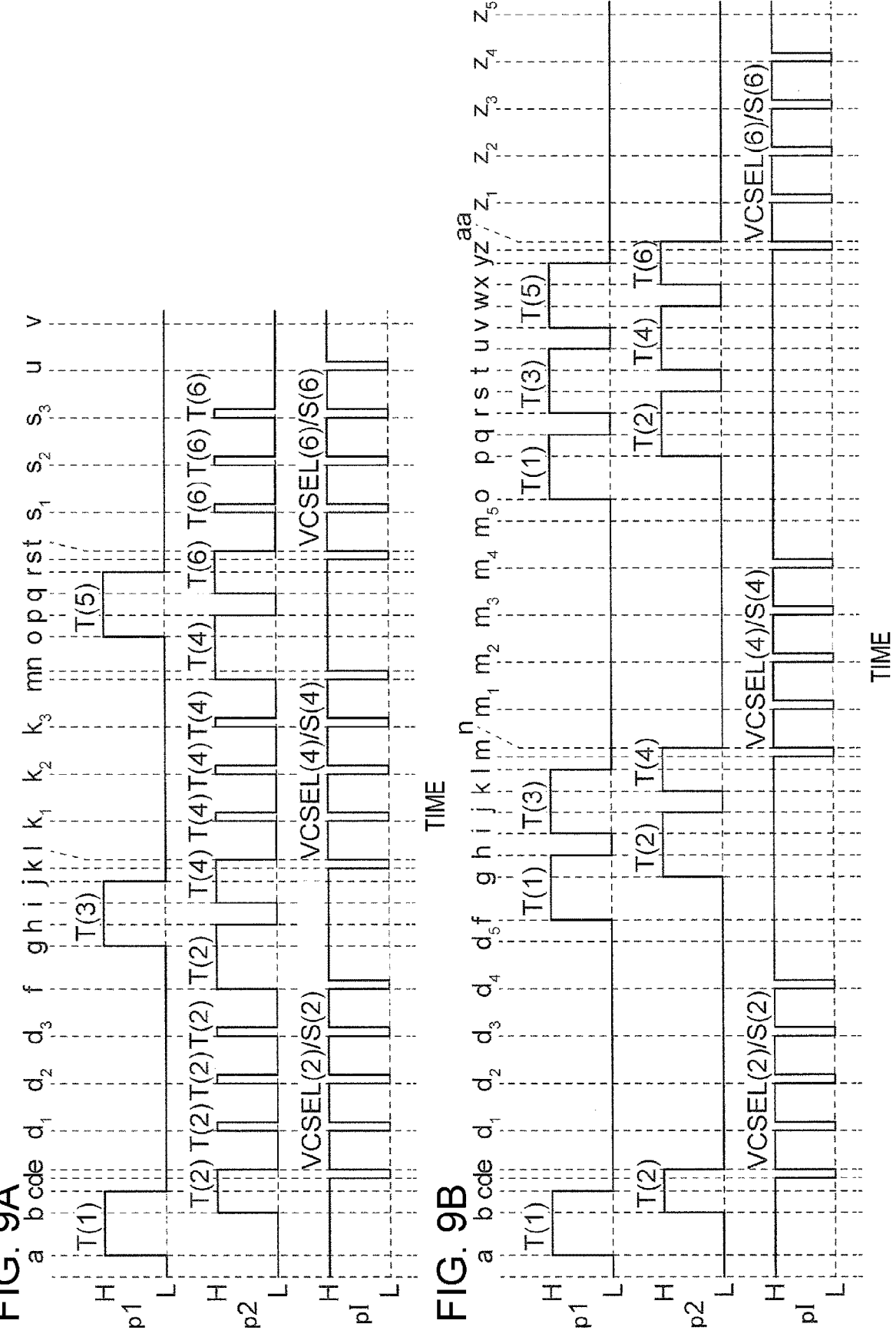
FIG. 9A is a timing chart illustrating the operation of the light source device shown in FIG. 1 to which a third exemplary embodiment is applied.
FIG. 9B is a timing chart for comparison to which the first exemplary embodiment is applied.

FIG. 9A is a timing chart illustrating the operation of the light source device 1 to which the third exemplary embodiment is applied. FIG. 9B is a timing chart for comparison to which the first exemplary embodiment is applied. The horizontal axis indicates the time and the time elapses in alphabetical order. The timings at which the same VCSEL emits light multiple times are indicated by the same alphabetical character as that used for the timing at which this VCSEL emits light for the first time. For each of these timings, the alphabetical character is appended with the corresponding number. The times indicated by the alphabetical characters in FIG. 9A and those in FIG. 9B are different from each other and are also different from those in FIGS. 4, 5, 6A, 6B, 8A, and 8B. In FIGS. 9A and 9B, a temporal change in each of the shift signals p1 and p2 and the light-emitting signal pI is shown, and the shift thyristor T, the light-emission control thyristor S, and the VCSEL which are turned ON are each indicated by its alphabetical character and number.

In FIGS. 9A and 9B, the VCSEL(2), VCSEL(4), and VCSEL(6) are sequentially caused to emit light. To implement this, as is seen from FIG. 1, the shift thyristors T(2), T(4), and T(6) are sequentially turned ON. This is an example of a case in which, after a certain VCSEL is caused to emit light, the next VCSEL to emit light is located on the downstream side in the shifting direction of the shifter 12. The shift thyristor T, coupling transistor Q, light-emission control thyristor S, and VCSEL are operated as discussed with reference to FIGS. 2A and 4, and a detailed explanation of the operation will be omitted.

The timing chart of FIG. 9A to which the third exemplary embodiment is applied will be explained.

Before time a, the light-emitting unit 10 is in the initial state, and the shift thyristor T(1) is in the state in which it can shift to the ON state. At time a, the shift signal p1 is changed from "L" (0 V) to "H" (7 V), and the shift thyristor T(1) is turned ON. At time b, the shift signal p2 is changed from "L"

(0 V) to "H" (7 V), and the shift thyristor T(2) is turned ON. At time c, the shift signal p1 is changed from "H" (7 V) to "L" (0 V) and the shift thyristor T(1) is turned OFF. In this state, no shift thyristor T other than the shift thyristor T(2) is ON, and the VCSEL(2) enters a state in which it can emit light.

At time d, the light-emitting signal pI is changed from "H" (7 V) to "L" (0 V), and the driver Dry is changed from OFF to ON and the VCSEL(2) is caused to emit light. At time e, the shift signal p2 is changed from "H" (7 V) to "L" (0 V) and the shift thyristor T(2) is turned OFF. At time e, the light-emitting signal pI is changed from "L" (0 V) to "H" (7 V), and the driver Dry is changed from ON to OFF and the VCSEL(2) stops emitting light. The VCSEL(2) emits a light-emitting pulse from time d to time e.

At time $d_1$, time $d_2$, and time $d_3$, the light-emitting signal pI is changed from "H" (7 V) to "L" (0 V) and the VCSEL(2) intermittently emits light. At the time (not shown) after each of time $d_1$, time $d_2$, and time $d_3$, the light-emitting signal pI is changed from "L" (0 V) to "H" (7 V) and the VCSEL(2) stops emitting light. That is, at time $d_1$, time $d_2$, and time $d_3$, the VCSEL(2) emits a light-emitting pulse similar to that from time d to time e. At time $d_1$, time $d_2$, and time $d_3$, the shift signal p2 is changed from "L" (0 V) to "H" (7 V) so as to intermittently turn ON the shift thyristor T(2). At the time (not shown) after each of time $d_1$, time $d_2$, and time $d_3$, the shift signal p2 is changed from "H" (7 V) to "L" (0 V) to turn OFF the shift thyristor T(2).

At time f, the light-emitting signal pI is changed from "H" (7 V) to "L" (0 V) and the VCSEL(2) is caused to emit light. At time f, the shift signal p2 is changed from "L" (0 V) to "H" (7 V) and the shift thyristor T(2) is turned ON. At the time (not shown) after time f, the light-emitting signal pI is changed from "L" (0 V) to "H" (7 V) and the VCSEL(2) stops emitting light. As a result, the VCSEL(2) intermittently emits light five times. That is, the VCSEL(2) emits five light-emitting pulses.

At time g, the shift signal p1 is changed from "L" (0 V) to "H" (7 V) and the shift thyristor T(3) is turned ON. Then, at time h, the shift signal p2 is changed from "H" (7 V) to "L" (0 V) and the shift thyristor T(2) is turned OFF. At time i, the shift signal p2 is changed from "L" (0 V) to "H" (7 V) and the shift thyristor T(4) is turned ON. At time j, the shift signal p1 is changed from "H" (7 V) to "L" (0 V) and the shift thyristor T(3) is turned OFF. In this state, no shift thyristor T other than the shift thyristor T(4) is ON and the VCSEL(4) enters a state in which it can emit light.

At time k, the light-emitting signal pI is changed from "H" (7 V) to "L" (0 V), and the light-emission control thyristor S(4) is turned ON and the VCSEL(4) emits light. At time l, the shift signal p2 is changed from "H" (7 V) to "L" (0 V) and the shift thyristor T(4) is turned OFF. At time l, the light-emitting signal pI is changed from "L" (0 V) to "H" (7 V) and the VCSEL(4) stops emitting light. At time $k_1$, time $k_2$, and time $k_3$, the light-emitting signal pI is changed from "H" (7 V) to "L" (0 V) and the VCSEL(4) intermittently emits light. At the time (not shown) after each of time $k_1$, time $k_2$, and time $k_3$, the light-emitting signal pI is changed from "L" (0 V) to "H" (7 V) and the VCSEL(4) stops emitting light. At time $k_1$, time $k_2$, and time $k_3$, the shift signal p2 is changed from "L" (0 V) to "H" (7 V) so as to intermittently turn ON the shift thyristor T(4). At the time (not shown) after each of time $k_1$, time $k_2$, and time $k_3$, the shift signal p2 is changed from "H" (7 V) to "L" (0 V) to turn OFF the shift thyristor T(4).

At time m, the light-emitting signal pI is changed from "H" (7 V) to "L" (0 V) and the VCSEL(4) is caused to emit light. At time m, the shift signal p2 is changed from "L" (0 V) to "H" (7 V) and the shift thyristor T(4) is turned ON. At the time (not shown) after time m, the light-emitting signal pI is changed from "L" (0 V) to "H" (7 V) and the VCSEL(4) stops emitting light. As a result, the VCSEL(4) intermittently emits light five times. That is, the VCSEL(4) emits five light-emitting pulses.

At time o, the shift signal p1 is changed from "L" (0 V) to "H" (7 V) and the shift thyristor T(5) is turned ON. Then, at time p, the shift signal p2 is changed from "H" (7 V) to "L" (0 V) and the shift thyristor T(4) is turned OFF. At time q, the shift signal p2 is changed from "L" (0 V) to "H" (7 V) and the shift thyristor T(6) is turned ON. At time r, the shift signal p1 is changed from "H" (7 V) to "L" (0 V) and the shift thyristor T(5) is turned OFF. In this state, no shift thyristor T other than the shift thyristor T(6) is ON and the VCSEL(6) enters a state in which it can emit light.

At time s, the light-emitting signal pI is changed from "H" (7 V) to "L" (0 V), and the light-emission control thyristor S(6) is turned ON and the VCSEL(6) emits light. At time t, the shift signal p2 is changed from "H" (7 V) to "L" (0 V) and the shift thyristor T(6) is turned OFF. At time t, the light-emitting signal pI is changed from "L" (0 V) to "H" (7 V) and the VCSEL(6) stops emitting light. At time $s_1$, time $s_2$, and time $s_3$, the light-emitting signal pI is changed from "H" (7 V) to "L" (0 V) and the VCSEL(6) intermittently emits light. At the time (not shown) after each of time $s_1$, time $s_2$, and time $s_3$, the light-emitting signal pI is changed from "L" (0 V) to "H" (7 V) and the VCSEL(6) stops emitting light. At time $s_1$, time $s_2$, and time $s_3$, the shift signal p2 is changed from "L" (0 V) to "H" (7 V) so as to intermittently turn ON the shift thyristor T(6). At the time (not shown) after each of time $s_1$, time $s_2$, and time $s_3$, the shift signal p2 is changed from "H" (7 V) to "L" (0 V) to turn OFF the shift thyristor T(6).

At time u, the light-emitting signal pI is changed from "H" (7 V) to "L" (0 V) and the VCSEL(6) is caused to emit light. At the time (not shown) after time u, the light-emitting signal pI is changed from "L" (0 V) to "H" (7 V) and the VCSEL(6) stops emitting light. As a result, the VCSEL(6) intermittently emits light five times. That is, the VCSEL(6) emits five light-emitting pulses. At time u, the shift signal p2 is not changed from "L" (0 V) to "H" (7 V).

As discussed above, according to the timing chart to which the third exemplary embodiment is applied, at a timing at which a VCSEL is caused to reemit light, the shift thyristor T corresponding to this VCSEL is turned ON again. Then, the shift operation is performed starting from this shift thyristor T until the shift thyristor T corresponding to the next VCSEL to emit light. The next VCSEL is then caused to emit light. For example, at time $d_1$, time $d_2$, time $d_3$, and time f, the VCSEL(2) is caused to reemit light, and the shift thyristor T(2) is also turned ON. Then, the shift operation is performed from the shift thyristor T(2) until the shift thyristor (4), which corresponds to the VCSEL(4) to emit light next time. The VCSEL(4) and the VCSEL(6) are caused to emit light similarly to the VCSEL(2) and the VCSEL(4) as described above. In the above-described example, even-numbered VCSELs, that is, the VCSEL(2), VCSEL(4), and VCSEL(6), are caused to emit light in this order. However, any VCSELs, such as odd-numbered VCSELs, a mixture of even-numbered VCSELs and odd-numbered VCSELs, may be sequentially caused to emit light as long as they are arranged from the upstream side to the downstream side.

Even after the shift thyristor T is turned OFF, that is, a current supply is stopped, the voltage at the n-gate Gn of the shift thyristor T gradually rises toward the power supply potential VGK (7 V), as in the n-gate Gn of the light-emission control thyristor S shown in FIG. 6B. Accordingly, if the shift signal p1 or p2 is changed from "L" (0 V) to "H" (7 V) during the period for which the shift thyristor T can be turned ON, such as at a timing at which the VCSEL reemits light, the shift thyristor T is turned ON again. That is, ON information is maintained in the shift thyristor T which is to be turned ON. The shift operation is restarted from the shift thyristor T which is turned ON, and a VCSEL located on the downstream side of the VCSEL which has previously emitted light is set as the next VCSEL to emit light. If the period for which the shift thyristor T can be turned ON has elapsed, the shift thyristor T is not turned ON. Hence, the interval from when the shift signal p1 or p2 is at "L" (0 V) until when it is at "H" (7 V) and the period (width) for which the shift signal p1 or p2 is at "H" (7 V) are set based on the period for which the shift thyristor T can be turned ON. Although in FIG. 9A the timing at which the VCSEL reemits light and the timing at which the shift thyristor T is turned ON again are the same (time $d_1$, time $d_2$, and time $d_3$, for example), they may be different from each other. Likewise, the period (width) for which the shift signal p1 or p2 is at "H" (7 V) and the period (width) for which the light-emitting signal pI is at "L" (0 V) may be different from each other.

If no VCSEL to emit light next time is located on the downstream side of the shift operation, there is no need to turn ON the shift thyristor T again. For example, at time u in FIG. 9A, the shift thyristor T(6) is not turned ON. This stops the shift thyristor T(6) from being turned ON again. That is, the shifter 12 enters the OFF state and the light-emitting unit 10 returns to the initial state. In addition to at time u, the shift thyristor T(6) may not necessarily be turned ON at time $s_1$, time $s_2$, and time $s_3$.

In the timing chart of FIG. 9B to which the first exemplary embodiment is applied, after the VCSEL(2) is caused to emit light five times from time d to time $d_5$, the shifter 12 restarts the shift operation from the shift thyristor T(1) at time f and then turns ON the shift thyristor T(4) to set the VCSEL(4) as the next VCSEL to emit light. Likewise, after the VCSEL (4) is caused to emit light five times from time m to time $m_5$, the shifter 12 restarts the shift operation from the shift thyristor T(1) at time o and then turns ON the shift thyristor T(6) to set the VCSEL(6) as the next VCSEL to emit light. That is, in the timing chart of FIG. 9B, every time the VCSEL to emit light is changed, the shift operation is restarted from the shift thyristor T(1) to set the next VCSEL to emit light.

The timing chart of FIG. 9A to which the third exemplary embodiment is applied does not include the period from time $d_4$ to time g and the period from time $m_4$ to t in the timing chart of FIG. 9B. That is, in the timing chart of FIG. 9A, there is no need to restart the shift operation from the shift thyristor T(1), which reduces the time taken to set a VCSEL to emit light.

The timing at which the shift thyristor T is turned ON again may desirably be a timing at which a light-emitting current is supplied to the VCSEL corresponding to this shift thyristor T, in other words, while the supplying of a light-emitting current to this VCSEL is about to stop. For example, at time f in FIG. 9A, the shift thyristor T(2) is turned ON again when a light-emitting current is supplied to the VCSEL(2), in other words, while the supplying of a light-emitting current to the VCSEL(2) is about to stop. This further reduces the time taken to set the VCSEL to emit light next time.

Fourth Exemplary Embodiment

In the third exemplary embodiment, the shift signal p1 or p2 is intermittently set at "H" (7 V) to turn ON the shift thyristor T of the shifter 12 again. In a fourth exemplary embodiment, the shift thyristor T is turned ON again without intermittently setting the shift signal p1 or p2 at "H" (7 V) to maintain ON information in the shift thyristor T.

Figure 10:
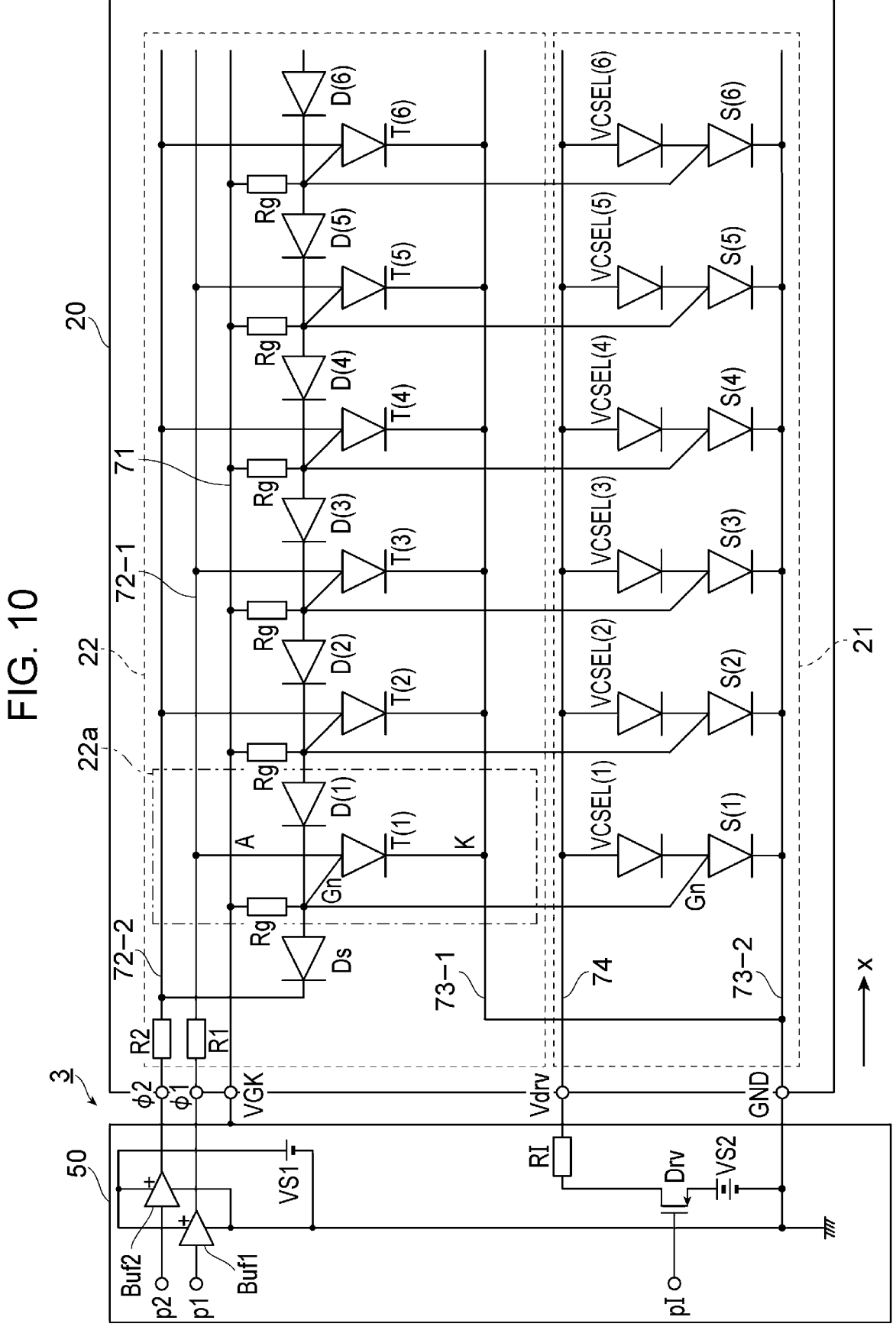
FIG. 10 illustrates a light source device according to a fourth exemplary embodiment.

FIG. 10 illustrates a light source device 3 according to the fourth exemplary embodiment. In FIG. 10, the right-side direction in the plane of the drawing is set to be a +x direction.

The light source device 3 includes a light-emitting unit 20 and a controller 50. The controller 50 of the light source device 3 is similar to that of the light source device 1 shown in FIG. 1, and an explanation thereof is thus omitted.

(Light-Emitting Unit 20)

The light-emitting unit 20 includes a light-emitting section 21 and a shifter 22. The light-emitting section 21 is similar to the light-emitting section 11 of the light-emitting unit 10. Elements of the light-emitting unit 20 similar to those of the light-emitting unit 10 are designated by like reference numerals and an explanation thereof will be omitted.

The shifter 22 includes multiple shift thyristors T, coupling diodes D, and power supply line resistors Rg. In FIG. 10, six shift thyristors T (shift thyristors T(1) through T(6)) and six coupling diodes D (coupling diodes D(1) through D(6)) are shown. Hereinafter, the shift thyristors T(1) through T(6) may collectively be called the shift thyristor T unless it is necessary to distinguish them from each other. Likewise, the coupling diodes D(1) through D(6) may collectively be called the coupling diode D unless it is necessary to distinguish them from each other. The shifter 22 also includes six power supply line resistors Rg, which are not denoted by numbers. A shift thyristor T, a coupling diode D, and a power supply line resistor Rg form a shift unit 22a. Six shift units 22a are arranged from one side (−x direction) to the other side (+x direction) of the shifter 22. The shifter 22 includes a start diode Ds at the end of one side (−x direction). The light-emitting unit 20 also includes current limiting resistors R1 and R2.

In the shift unit 22a, the coupling transistor Q of the shift unit 12a of the light-emitting unit 10 is replaced by the coupling diode D. The connection relationship of the elements in the shift unit 22a is also different from that in the shift unit 12a.

In the shift unit 22a, the n-gate Gn of the shift thyristor T is connected to the cathode of the coupling diode D. The n-gate Gn of the shift thyristor T is also connected to one end of the power supply line register Rg. The other end of the power supply line resistor Rg is connected to the power supply line 71. The n-gate Gn of the shift thyristor T is also connected to the n-gate Gn of the light-emission control thyristor S of the light-emitting section 21. The anode of the coupling diode D is connected to the n-gate Gn of the adjacent shift thyristor T. The anode and the cathode of the coupling diode D are not appended with the alphabetical characters A and K.

The cathode of the coupling diode D(1) is connected to the n-gate Gn of the shift thyristor T(1), while the anode of the coupling diode D(1) is connected to the n-gate Gn of the shift thyristor T(2). That is, the coupling diodes D(l) through D(6) are connected in series with each other so that the anode of one coupling diode D is connected to the cathode of another coupling diode D.

Regarding the start diode Ds, which is disposed at the end of one side (−x direction) of the shifter 22, the anode is connected to the n-gate Gn of the shift thyristor T(1), the cathode of the coupling diode D(1), one end of the power supply line resistor Rg, and the n-gate Gn of the light-emission control thyristor S(1). The cathode of the start diode Ds is connected to the shift signal line 72-2 to which the shift signal p2 is supplied.

The basic operation of the shifter 22 will be described below.

The initial state of the light source device 3 is a state in which the power supply line 71 is at the power supply potential VGK (7 V), the ground line 73 is at the ground potential GND (0 V), the shift signals p1(φ1) and p2(φ2) are at "L" (0 V), the driver Dry is OFF, and the light-emitting power supply potential VS2 (7 V) is not applied to the light-emitting potential line 74.

In the initial state, the n-gate Gn of the shift thyristor T(1) is connected via the power supply line resistor Rg to the power supply line 71 having the power supply potential VGK (7 V) and is also connected via the start diode Ds to the shift signal line 72-2 to which the shift signal p2 at "L" (0 V) is supplied. The n-gate Gn of the shift thyristor T(1) thus becomes equal to the forward voltage Vd (1.5 V) of the start diode Ds. The anode A of the shift thyristor T(1) is connected to the shift signal line 72-1. When the shift signal p1 to be supplied to the shift signal line 72-1 is changed from "L" (0 V) to "H" (7 V), the anode A (7 V) and the n-gate Gn (1.5 V) of the shift thyristor T(1) is forward-biased, and the shift thyristor T(1) is turned ON and shifts from the OFF state to the ON state. Then, the voltage at the n-gate Gn of the shift thyristor T(1) drops to almost 0 V.

The n-gate Gn of the shift thyristor T(1) is connected to the n-gate Gn of the shift thyristor T(2) via the coupling diode D(1). The n-gate Gn of the shift thyristor T(2) thus becomes equal to 1.5 V.

The n-gate Gn of the shift thyristor T(1) is connected to the n-gate Gn of the light-emission control thyristor S(1). The n-gate Gn of the light-emission control thyristor S(1) thus drops to almost 0 V. When the light-emitting signal pI is changed from "H" (7 V) to "L" (0 V) and the light-emitting power supply potential VS2 (7 V) is applied to the light-emitting potential line 74, the anode A and the n-gate Gn of the light-emission control thyristor S(1) is forward-biased. Then, the light-emission control thyristor S(1) is turned ON and the VCSEL(1) emits light.

Figure 11:
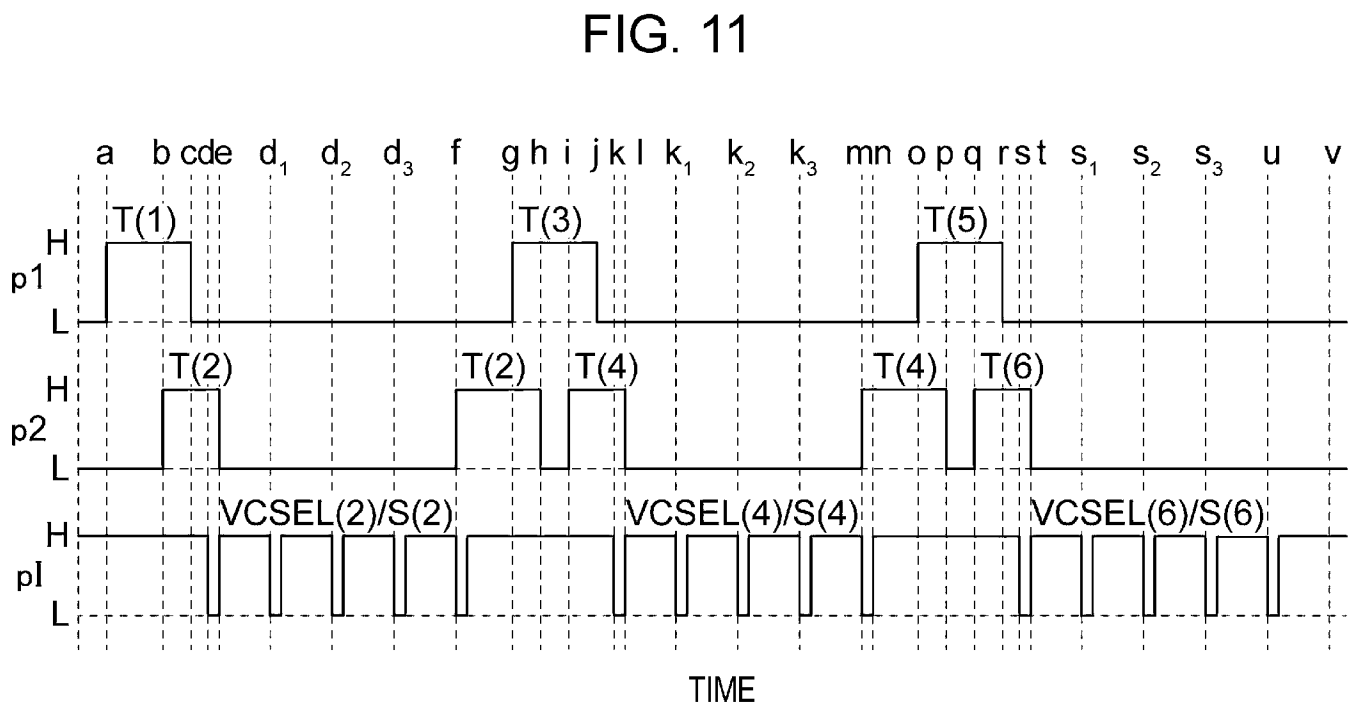

FIG. 11 is a timing chart, based on which the light source device 3 of the fourth exemplary embodiment is operated. In FIG. 11, the VCSEL(2), VCSEL(4), and VCSEL(6) are caused to emit light in this order, as in the timing charts in FIGS. 9A and 9B. The timing chart of FIG. 11 does not include the period for which the shift signal p2 is changed to "H" (7 V) at time d₁, time d₂, time d₃, time time k₂, time k₃, time s₁, time s₂, and time s₃ in the timing chart of FIG. 9A to which the third exemplary embodiment is applied.

When the VCSEL emits light, the n-gate Gn of the light-emission control thyristor S drops to almost 0 V. As shown in FIG. 10, the n-gate Gn of the light-emission control thyristor S is connected to the n-gate Gn of the shift thyristor T. Accordingly, when the voltage at the n-gate Gn of the light-emission control thyristor S drops to almost 0 V, the voltage at the n-gate Gn of the shift thyristor T also drops to almost 0 V. When the shift signal p1 or p2 is changed from "L" (0 V) to "H" (7 V), the shift thyristor T corresponding to the VCSEL which is caused to emit light is turned ON.

Time f is a timing at which the VCSEL(2) is ready to reemit light. The VCSEL(2) is thus caused to reemit light, and also, the shift signal p2 is changed from "L" (0 V) to "H" (7 V) and the shift thyristor T(2) is turned ON. Time m is a timing at which the VCSEL(4) is ready to reemit light. The VCSEL(4) is thus caused to reemit light, and also, the shift signal p2 is changed from "L" (0 V) to "H" (7 V) and the shift thyristor T(4) is turned ON. In this manner, when a VCSEL which is to emit light next time is located on the downstream side, the shift operation can be restarted from a shift thyristor T which is turned ON. This can reduce the time taken to set the VCSEL to emit light.

The timing at which the shift thyristor T is turned ON again may desirably be a timing at which a light-emitting current is supplied to the VCSEL corresponding to this shift thyristor T, in other words, while the supplying of a light-emitting current to this VCSEL is about to stop. For example, at time f in FIG. 11, the shift thyristor T(2) is turned ON again when a light-emitting current is supplied to the VCSEL(2), in other words, while the supplying of a light-emitting current to the VCSEL(2) is about to stop. This further reduces the time taken to set the VCSEL to emit light next time.

In the light-emitting unit 20 according to the fourth exemplary embodiment, the n-gate Gn of the light-emission control thyristor S is connected to the n-gate Gn of the shift thyristor T. The voltage at the n-gate Gn of the shift thyristor T is thus shifted in response to a change in the voltage at the n-gate Gn of the light-emission control thyristor S due to the light emission of the VCSEL. In contrast, in the light-emitting unit 10 (see FIG. 1) of the first exemplary embodiment, the n-gate Gn of the light-emission control thyristor S is connected to the collector Cs of the coupling transistor Q. Hence, the voltage at the n-gate Gn of the shift thyristor T is not shifted even when the voltage at the n-gate Gn of the light-emission control thyristor S is changed due to the light emission of the VCSEL.

Although the cathode common configuration is employed in the above-described light-emitting units 10 and 20, the anode common configuration may be utilized. In this case, instead of providing n-ohmic electrodes on an n-gate layer (n-type semiconductor layer 83), p-ohmic electrodes may be provided on a p-gate layer (p-type semiconductor layer 82).

In the shifter 12 of the light-emitting unit 10, a coupling transistor Q is used to connect shift thyristors T. In the shifter 22 of the light-emitting unit 20, a coupling diode D is used to connect shift thyristors T. Alternatively, a resistor may be used to connect shift thyristors T.

(Measurement Apparatus 100)

The light source devices 1, 2, and 3 of the first through fourth exemplary embodiments may be applicable to a measurement apparatus that measures a three-dimensional configuration (hereinafter called a 3D configuration) of a subject to be measured. The measurement apparatus is an apparatus that measures a 3D configuration based on a time-of-flight (ToF) method using the time-of-flight of light. The measurement apparatus includes a light source device and a three-dimensional sensor (hereinafter called a 3D sensor). According to the ToF method, the time from when light is emitted from the light source device until when the 3D sensor receives light reflected by a subject is measured, and based on the measured time, the distance to the subject is calculated. The 3D configuration of the subject is specified in this manner. Measuring a 3D configuration may also be called three-dimensional measurement, 3D measurement, and 3D sensing. The 3D sensor is an example of a light receiver.

The measurement apparatus may be used for recognizing a subject from its specified 3D configuration. For example, the measurement apparatus may be installed in a mobile information processing terminal and be used for recognizing the face of a user who has accessed the mobile information processing terminal. That is, the measurement apparatus obtains the 3D configuration of the face of a user having accessed the mobile information processing terminal, determines whether the user is authorized to access the terminal, and permits the user to use the terminal only when the user is an authorized user.

The measurement apparatus may also be used for continuously measuring the 3D configuration of a subject, such as in augmented reality (AR).

The measurement apparatus may also be applied to an information processing apparatus, such as a personal computer (PC), other than a mobile information processing terminal.

Figure 12:
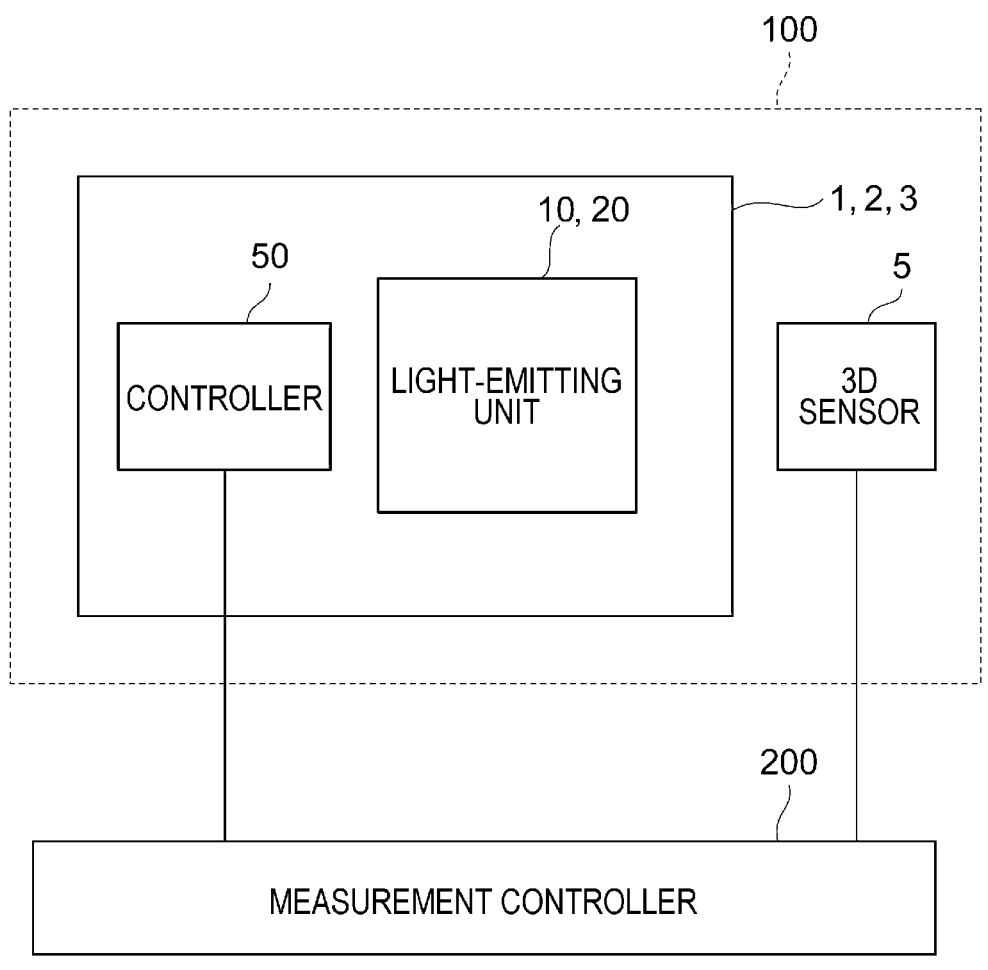
FIG. 12 is a block diagram illustrating the configuration of a measurement apparatus.

FIG. 12 is a block diagram illustrating the configuration of a measurement apparatus 100. The measurement apparatus 100 includes a 3D sensor 5 and the light source device 1 provided with the light-emitting unit 10 and the controller 50. Instead of the light source device 1, the light source device 2 or the light source device 3 including the light-emitting unit 20 and the controller 50 may be used. In FIG. 12, the light source device is denoted by reference numerals 1, 2, and 3, and the light-emitting unit is denoted by reference numerals 10 and 20. The light source device 1 emits light toward a subject. The 3D sensor 5 receives light (reflected light) reflected by and returned from the subject. The 3D sensor 5 outputs information on the distance to the subject (distance information), which is measured by the ToF method based on the time from when light is emitted until when the reflected light is returned. The measurement apparatus 100 may include a measurement controller 200. The measurement controller 200 is constituted by a computer including a central processing unit (CPU), a read only memory (ROM), and a random access memory (RAM), for example. The measurement controller 200 specifies the 3D configuration of a subject, based on the distance information obtained from the 3D sensor 5.

The present disclosure may also be implemented as follows.

In a light-emitting unit, a shifter is constituted by shift elements through which the ON state is transferred in order of the arrangement of the shift elements. This configuration may make it easier to form the shifter than in the configuration in which the ON state is not transferred.

In a light-emitting unit, as a result of a thyristor of a shifter entering the ON state, a light-emitting element is changed to a state in which it can emit light due to a thyristor function. This may make it possible to separately control the shifter and control the light-emitting unit.

In a light-emitting unit, a light-emitting element is constituted by a surface emitting element and a thyristor connected in series with each other. This may make it easy to enhance the light-emission characteristics.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light source device comprising:
a light-emitting section including a plurality of light-emitting elements, wherein each of the plurality of light-emitting elements includes a light-emission control thyristor and a surface emitting element connected in series with the light-emission control thyristor;

a shifter configured to perform a shift operation, wherein the shifter includes a plurality of shift thyristors and either a plurality of coupling transistors or a plurality of coupling diodes, wherein the plurality of shift thyristors and the plurality of coupling transistors or coupling diodes are respectively connected to each other, and the plurality of light-emitting elements are connected to the shifter; and a controller configured to cause the shifter to perform the shift operation to set, among the plurality of light-emitting elements, a light-emitting element which is to emit light by controlling a corresponding one of the plurality of shift thyristors to be turned ON, wherein the set light-emitting element is configured to be shifted to a state in which the set light-emitting element is able to emit light when the corresponding one of the plurality of shift thyristors is turned ON, wherein the controller is further configured to change the shifter to an OFF state after the set light-emitting element is shifted to a state in which the set light-emitting element is able to emit light, and to cause the set light-emitting element to emit light a plurality of times by turning ON and OFF a voltage application side of a power source, the power source supplying a light-emitting current which causes the light-emitting element to emit light.

2. The light source device according to claim 1, wherein, when a period from a start of the shift operation until an end of the shift operation is assumed to be one cycle by the controller, the shifter sets one light-emitting element in one cycle.

3. The light source device according to claim 2, wherein the controller is configured to change the shifter to the OFF state after the set light-emitting element is shifted to a state in which the set light-emitting element is able to emit light and before the set light-emitting element stops emitting light.

4. The light source device according to claim 1, wherein the controller is configured to change the shifter to the OFF state by setting a shift signal, which is to be supplied to the shifter by the controller, to be a ground potential.

5. The light source device according to claim 1, wherein, during a period for which the set light-emitting element is ready to reemit light after supplying of the light-emitting current to the set light-emitting element has stopped, the controller is configured to supply the light-emitting current to the set light-emitting element again and causes the set light-emitting element to emit light.

6. The light source device according to claim 5, wherein the controller is configured to supply a pulse of a current, which is smaller than the light-emitting current, to the set light-emitting element during an interval between light-emitting operations of the set light-emitting element, the pulse serving to reset the period for which the set light-emitting element is ready to reemit light.

7. A light source device comprising:

a light-emitting section including a plurality of light-emitting elements, wherein each of the plurality of light-emitting elements includes a light-emission control thyristor and a surface emitting element connected in series with the light-emission control thyristor;

a shifter including a plurality of shift elements through which an ON state is sequentially transferred in a predetermined order, wherein the plurality of shift elements include a plurality of shift thyristors and either a plurality of coupling transistors or a plurality of coupling diodes, wherein the plurality of shift thyristors and the plurality of coupling transistors or coupling diodes are respectively connected to each other, and the plurality of light-emitting elements are connected to the shifter; and a controller configured to cause the shifter to set, among the plurality of light-emitting elements, a light-emitting element which is to emit light by controlling a corresponding one of the plurality of shift thyristors to be turned ON, wherein the set light-emitting element is configured to be shifted to a state in which the set light-emitting element is able to emit light when the corresponding one of the plurality of shift thyristors is turned ON, wherein the controller is further configured to change the shifter to an OFF state after the set light-emitting element is shifted to a state in which the set light-emitting element is able to emit light and before the ON state is transferred through all of the plurality of shift elements.

8. A light source device comprising:

a light-emitting section including a plurality of light-emitting elements, wherein each of the plurality of light-emitting elements includes a light-emission control thyristor and a surface emitting element connected in series with the light-emission control thyristor;

a shifter configured to perform a shift operation, wherein the shifter includes a plurality of shift thyristors and either a plurality of coupling transistors or a plurality of coupling diodes, wherein the plurality of shift thyristors and the plurality of coupling transistors or coupling diodes are respectively connected to each other, and the plurality of light-emitting elements are connected to the shifter; and a controller configured to cause the shifter to set, among the plurality of light-emitting elements, a light-emitting element which is to emit light by controlling a corresponding one of the plurality of shift thyristors to be turned ON, wherein the set light-emitting element is configured to be shifted to a state in which the set light-emitting element is able to emit light when the corresponding one of the plurality of shift thyristors is turned ON, wherein the controller is further configured to change the shifter to an OFF state after the set light-emitting element is shifted to a state in which the set light-emitting element is able to emit light and before the set light-emitting element stops emitting light.

9. The light source device according to claim 8, wherein, while supplying of a light-emitting current to the set light-emitting element is about to stop, the controller is configured to turn ON the shifter again to set a light-emitting element which is to subsequently emit light.

10. A measurement apparatus comprising:

the light source device according to claim 1; and a light receiver configured to receive light which is emitted from the light-emitting section of the light source device and which is reflected by a subject to be measured.

11. A measurement apparatus comprising:

the light source device according to claim 7; and a light receiver configured to receive light which is emitted from the light-emitting section of the light source device and which is reflected by a subject to be measured.

12. A measurement apparatus comprising:

the light source device according to claim 2; and a light receiver configured to receive light which is emitted from the light-emitting section of the light source device and which is reflected by a subject to be measured.

13. A measurement apparatus comprising:

the light source device according to claim 3; and a light receiver configured to receive light which is emitted from the light-emitting section of the light source device and which is reflected by a subject to be measured.

14. A measurement apparatus comprising:

the light source device according to claim 8; and a light receiver configured to receive light which is emitted from the light-emitting section of the light source device and which is reflected by a subject to be measured.

15. A measurement apparatus comprising:

the light source device according to claim 9; and a light receiver configured to receive light which is emitted from the light-emitting section of the light source device and which is reflected by a subject to be measured.

16. A measurement apparatus comprising:

the light source device according to claim 4; and a light receiver configured to receive light which is emitted from the light-emitting section of the light source device and which is reflected by a subject to be measured.

17. A measurement apparatus comprising:

the light source device according to claim 5; and a light receiver that receives-configured to receive light which is emitted from the light-emitting section of the light source device and which is reflected by a subject to be measured.

18. A measurement apparatus comprising:

the light source device according to claim 6; and a light receiver configured to receive light which is emitted from the light-emitting section of the light source device and which is reflected by a subject to be measured.

\* \* \* \* \*